(12) United States Patent  
Moddel

(10) Patent No.: US 12,166,434 B2  
(45) Date of Patent: Dec. 10, 2024

(54) ENHANCED QUANTUM VACUUM ENERGY DEVICES

(71) Applicant: The Regents of the University of Colorado, a body corporate, Denver, CO (US)

(72) Inventor: Garret Moddel, Boulder, CO (US)

(73) Assignee: The Regents of the University of Colorado, a body corporate, Denver, CO (US)

(*) Notice: Subject to any disclaimer, the term of this patent is extended or adjusted under 35 U.S.C. 154(b) by 176 days.

(21) Appl. No.: 17/570,059

(22) Filed: Jan. 6, 2022

(65) Prior Publication Data

US 2022/0216812 A1 Jul. 7, 2022

Related U.S. Application Data

(60) Provisional application No. 63/134,303, filed on Jan. 6, 2021.

(51) Int. Cl.  
*H10N 10/10* (2023.01)  
*H02N 11/00* (2006.01)

(52) U.S. Cl.  
CPC ......... *H02N 11/008* (2013.01); *H10N 10/10* (2023.02)

(58) Field of Classification Search  
CPC .................... H02N 11/008; H10N 10/10  
See application file for complete search history.

(56) References Cited

U.S. PATENT DOCUMENTS

| | | |
|---|---|---|
| 5,590,031 A | 12/1996 | Mead, Jr. et al. |
| 6,477,028 B1 | 11/2002 | Pinto |
| 6,593,566 B1 | 7/2003 | Pinto |
| 6,650,527 B1 | 11/2003 | Pinto |
| 6,665,167 B2 | 12/2003 | Pinto |
| 6,842,326 B2 | 1/2005 | Pinto |
| 6,920,032 B2 | 7/2005 | Pinto |
| 7,379,286 B2 | 5/2008 | Haisch et al. |
| 7,411,772 B1 | 8/2008 | Tymes |
| 8,039,368 B2 | 10/2011 | Drndic et al. |

(Continued)

FOREIGN PATENT DOCUMENTS

| | | |
|---|---|---|
| JP | 2019192910 | * 10/2021 |
| WO | 0071894 A1 | 11/2000 |
| WO | 2020229944 A1 | 11/2020 |

OTHER PUBLICATIONS

The Casimir effect: A force from nothing, 2002.*

(Continued)

*Primary Examiner* — Uyen M Tran  
(74) *Attorney, Agent, or Firm* — Cozen O'Connor

(57) ABSTRACT

Described herein are devices incorporating Casimir cavities, which modify the quantum vacuum mode distribution within the cavities. The Casimir cavities can create energy differences within layers or device to drive energy from or to a portion of a layer disposed adjacent to or contiguous with the Casimir cavity by modifying the quantum vacuum mode distribution incident on one portion of the layer to be different from the quantum vacuum mode distribution incident on another portion of the layer. Additionally, Casimir cavities in which the cavity layer comprises a conductor that can be used to carry a flow of electrical power induced by the presence of the Casimir cavity.

10 Claims, 13 Drawing Sheets

(56) References Cited

U.S. PATENT DOCUMENTS

| | | | |
|---|---|---|---|
| 8,317,137 | B2 | 11/2012 | Cormier |
| 8,803,340 | B2 | 8/2014 | Moddel |
| 8,913,366 | B1 | 12/2014 | Mezinis |
| 9,581,142 | B2 | 2/2017 | Moddel |
| 9,634,158 | B2 | 4/2017 | Kobayashi et al. |
| 10,199,414 | B2 | 2/2019 | Kobayashi et al. |
| 10,612,971 | B2 | 4/2020 | Huang et al. |
| 11,133,758 | B2 | 9/2021 | Moddel |
| 11,251,723 | B2 | 2/2022 | Moddel |
| 11,258,379 | B2 | 2/2022 | Moddel |
| 2006/0027709 | A1 | 2/2006 | Pinto |
| 2007/0007393 | A1 | 1/2007 | Pinto |
| 2007/0241470 | A1* | 10/2007 | Haisch ............... H02N 11/002 264/1.27 |
| 2008/0296437 | A1 | 12/2008 | Cormier |
| 2009/0322221 | A1 | 12/2009 | Makansi |
| 2010/0142259 | A1 | 6/2010 | Drndic et al. |
| 2010/0237198 | A1 | 9/2010 | Cormier |
| 2013/0283797 | A1 | 10/2013 | Bressi |
| 2014/0092520 | A1 | 4/2014 | Rosendorf |
| 2014/0092521 | A1* | 4/2014 | Rosendorf ............ H02N 11/008 977/734 |
| 2014/0158887 | A1 | 6/2014 | Rosendorf |
| 2014/0158906 | A1 | 6/2014 | Rosendorf |
| 2014/0353577 | A1 | 12/2014 | Agarwal et al. |
| 2014/0374865 | A1 | 12/2014 | Kobayashi et al. |
| 2017/0199078 | A1 | 7/2017 | Huang et al. |
| 2017/0338355 | A1 | 11/2017 | Kobayashi et al. |
| 2018/0059704 | A1 | 3/2018 | Villalobos |
| 2019/0207537 | A1 | 7/2019 | Bressi |
| 2020/0011978 | A1 | 1/2020 | Chu |
| 2020/0357997 | A1 | 11/2020 | Moddel |
| 2020/0358375 | A1 | 11/2020 | Moddel |
| 2020/0358376 | A1 | 11/2020 | Moddel |
| 2020/0395872 | A1 | 12/2020 | Moddel |

OTHER PUBLICATIONS

Grundler, "Zero-Point Energy and Casimir-Effect (The Essential Arguments for and Against the Assumption of a Physically Effective Zero-Point Energy)", Astrophysical Institute Neunhof, Circular Se08011, Online Available at: https://www.astrophys-neunhof.de/mtlg/se08011.pdf, Feb. 2013, pp. 1-47.
International Search Report and Written Opinion Mailed On May 20, 2022 for International Application No. PCT/US2022/011433, 23 pages.
Visser et al., "Follow-Up: What is the 'Zero-Point Energy' (or 'Vacuum Energy') in Quantum Physics? Is it Really Possible that we Could Harness this Energy?", Scientific American, Available Online at: https://www.scientificamerican.com/article/follow-up-what-is-the-zer/, Aug. 18, 1997, 7 pages.
Atar et al., "Plasmonically Enhanced Hot Electron Based Photovoltaic Device", Optics Express, vol. 21, No. 6, Mar. 25, 2013, pp. 7196-7201.
Blandford et al., "Applications of Classical Physics", Lecture Notes Chapter 6, California Institute of Technology, Version 12, Jan. 28, 2013, 23 pages.
Brongersma et al., "Plasmon-Induced Hot Carrier Science and Technology", Nature Nanotechnology, vol. 10, No. 1, Jan. 6, 2015, pp. 25-34.
Brongersma et al., "Surface Plasmon Nanophotonics", Springer Series in Optical Sciences, vol. 131, Sep. 2007, pp. 1-11.
Chalabi et al., "Hot-Electron Photodetection with a Plasmonic Nanostripe Antenna", Nano Letters, vol. 14, No. 3, Mar. 2014, pp. 1374-1380.
Clavero, "Plasmon Induced Hot-Electron Generation at Nanoparticle/Metal-Oxide Interfaces for Photovoltaic and Photocatalytic Devices", Nature Photonics, vol. 8, No. 2, Feb. 2014, pp. 95-103.
Cowell et al., "Barrier Height Estimation of Asymmetric Metal-Insulator—Metal-Tunneling Diodes", Journal of Applied Physics, vol. 114, No. 213703, Dec. 5, 2013, 7 pages.

Dmitriyeva et al., "Test of Zero-point Energy Emission From Gases Flowing Through Casimir Cavities", Physics Procedia, vol. 38, Nov. 8, 2012, pp. 8-17.
Du et al., "Ultrafast Plasmon Induced Electron Injection Mechanism in Gold—Ti02 Nanoparticle System", Journal of Photochemistry and Photobiology C: Photochemistry Reviews, vol. 15, Jun. 2013, pp. 21-30.
Gall, "Electron Mean Free Path in Elemental Metals", Journal of Applied Physics, vol. 199, Feb. 2016, pp. 085101-1-085101-5.
Genet et al., "Casimir Force and the Quantum Theory of Lossy Optical Cavities", Physical Review A, vol. 67, No. 4, Feb. 10, 2003, 18 pages.
Gong et al., "Design of Plasmonic Cavities for Solid-State Cavity Quantum Electrodynamics Applications", Applied Physics Letters, vol. 90, No. 3, Jan. 2007, pp. 033113-1-033113-3.
Grover et al., "Metal Single-Insulator and Multi-Insulator Diodes for Rectenna Solar Cells", Rectenna Solar Cells, Jul. 2013, 21 pages.
Helman et al., "Theory of Internal Photoemission", Physical Review B, vol. 7, No. 8, Apr. 15, 1973, pp. 3702-3705.
Herner et al., "High Performance MIIM Diode Based on Cobalt Oxide/Titanium Oxide", Applied Physics Letters, vol. 110, May 2017, pp. 223901-1-223901-4.
Intravaia et al., "Strong Casimir Force Reduction Through Metallic Surface Nanostructuring", Nature Communications, vol. 4, Issue 1, Sep. 27, 2013, pp. 1-8.
Jiang et al., "Photoelectrochemical Devices for Solar Water Splitting- Materials and Challenges", Chemical Society Reviews, vol. 46, No. 15, Jul. 2017, pp. 4645-4660.
John et al., "Optical Properties of Graphene, Silicene, Germanene, and Stanine from IR to Far UV—A First Principles Study", Journal of Physics and Chemistry of Solids, vol. 110, Nov. 2017, 1 page.
Kish, "Stealth Communication: Zero-Power Classical Communication, Zeroquantum Quantum Communication and Environmental-Noise Communication", Applied Physics Letters, vol. 87, No. 23, Dec. 2005, 15 pages.
Kish et al., "Zero-Point Term and Quantum Effects in the Johnson Noise of Resistors: A Critical Appraisal", Journal of Statistical Mechanics: Theory and Experiment, vol. 2016, No. 5, May 20, 2016, 13 pages.
Knight et al., "Embedding Plasmonic Nanostructure Diodes Enhances Hot Electron Emission", Nano Letters, vol. 13, No. 4, Mar. 2013, 1 page.
Kodama et al., "Fast Heating of Ultrahigh-Density Plasma as a Step Towards Laser Fusion Ignition", Nature, vol. 412, No. 6849, Aug. 23, 2001, pp. 798-802.
Lambe et al., "Light Emission from Inelastic Electron Tunneling", Physical Review Letters, vol. 37, No. 14, Oct. 4, 1976, pp. 923-925.
Lebedev et al., "The Dynamics of Wire Array Z-Pinch Implosions", Physics of Plasmas, vol. 6, No. 5, May 1999, 2 pages.
Li, "Latest Progress in Hydrogen Production from Solar Water Splitting Via Photocatalysis, Photoelectrochemical, and Photovoltaic-Photoelectrochemical Solutions", Chinese Journal of Catalysis, vol. 38, No. 1, Jan. 2017, pp. 5-12.
McCarthy et al., "Enhancement of Light Emission from Metal-Insulator—Metal Tunnel Junctions", Applied Physics Letters, vol. 30, No. 8, Apr. 1977, pp. 427-429.
Mizuguchi et al., "Simulation of High-Energy Proton Production by Fast Magnetosonic Shock Waves in Pinched Plasma Discharges", Physics of Plasmas, vol. 14, No. 3, Mar. 2007, pp. 032704-1-032704-7.
Moddel et al., "Extraction of Zero-Point Energy from the Vacuum: Assessment of Stochastic Electrodynamics-Based Approach as Compared to Other Methods", Atoms, vol. 7, No. 51, May 23, 2019, pp. 1-18.
Moddel, "Will Rectenna Solar Cells Be Practical?", Rectenna Solar Cells, Jul. 2013, pp. 3-24.
Ozawa et al., "Preparation and Characterization of the Eu3+ Doped Perovskite Nanosheet Phosphor: Lao.90Euo.osNb207", Chemistry of Materials, vol. 19, No. 26, Nov. 2007, pp. 6575-6580.
Sze et al., "Physics of Semiconductor Devices", John Wiley & Sons, Dec. 13, 2006, 5 pages.

(56) References Cited

OTHER PUBLICATIONS

Van Dorp et al., "SIC: A Photocathode for Water Splitting and Hydrogen Storage", Angewandte Chemie International Edition, vol. 48, No. 33, 2009, pp. 6085-6088.

Viswanath et al., "A Nanosheet Phosphor of Double-Layered Perovskite with Unusual Intrananosheet Site Activator Concentration", Chemical Engineering Journal, vol. 122044, Nov. 2019, 12 pages.

Walter et al., "Solar Water Splitting Cells", Chemical Reviews, vol. 110, No. 11, Nov. 2010, pp. 6446-6473.

Wang et al., "Field-Assisted Splitting of Pure Water Based on Deep-Sub—Debyelength Nanogap Electrochemical Cells", American Chemical Society Nano, vol. 11, No. 8, Jul. 2017, 13 pages.

Wang et al., "Light Emission from the Double-Barrier Al/Ah03/Al/Ah03/Au Tunnel Junction", Thin Solid Films, vol. 371, Nos. 1-2, Aug. 2000, pp. 191-194.

Wang et al., "Plasmonic Energy Collection Through Hot Carrier Extraction", Nano Letters, vol. 11, No. 12, Oct. 2011, 1 page.

Yam, "Exploiting Zero-Point Energy", Scientific American, vol. 277, No. 6, Dec. 1, 1997, pp. 54-57.

Zhu, "Graphene Geometric Diodes for Optical Rectennas", Department of Electrical, Computer, and Energy Engineering, University of Colorado, 2014, 112 pages.

Zhu, et al., "Graphene Geometric Diodes for Terahertz Rectennas", Journal of Physics D Applied Physics, vol. 46, No. 18, Apr. 2013, pp. 1-6.

International Search Report and Written Opinion mailed on Jul. 31, 2020 for International Application No. PCT/IB2020/054254, 11 pages.

International Search Report and Written Opinion mailed on Aug. 3, 2020 for International Application No. PCT/IB2020/054255, 11 pages.

International Search Report and Written Opinion mailed on Nov. 5, 2020 for International Application No. PCT/IB2020/054256, 13 pages.

International Search Report and Written Opinion mailed on Sep. 22, 2020 for International Application No. PCT/US2020/032251, 15 pages.

* cited by examiner

ENHANCED QUANTUM VACUUM ENERGY DEVICES

CROSS REFERENCE TO RELATED APPLICATIONS

This application claims the benefit of and priority to U.S. Provisional Application No. 63/134,303, filed on Jan. 6, 2021, which is hereby incorporated by reference in its entirety.

FIELD

This invention is in the field of electronic devices. This invention relates generally to quantum devices for harvesting and generating electrical energy.

BACKGROUND

According to quantum theory the quantum vacuum is filled with electromagnetic radiation in the form of quantum vacuum fluctuations. There has been substantial discussion about whether this energy can be harvested, and if so, how. A chief problem in harvesting this energy is that it forms the energy ground state, and so it does not flow from one region to another. However, the quantum vacuum energy is geometry-dependent, and its density is different in a Casimir cavity than outside of a Casimir cavity. The use of Casimir cavities therefore opens the possibility of making use of the quantum vacuum fluctuations to drive energy from one location to another.

SUMMARY

Devices for generation of electrical energy are described herein. In embodiments, devices described herein use two different regions in which the energy density of the quantum vacuum is different to drive energy across a layer or between two separate portions of a layer such that a portion of it can be harvested.

In an aspect, devices are disclosed for generation and capture of charge carriers that are excited by quantum vacuum fluctuations. Devices of this aspect may use an asymmetry in quantum vacuum fluctuations with respect to an electronic device to drive a flow of energy or particles or waves across the electronic device. An example device of this aspect comprises a conductive layer including a first portion and a section portion; and a zero-point-energy-density-modifying structure adjoining the first portion of the conductive layer, the zero-point-energy-density-modifying structure providing an asymmetry that drives a flow of energy between the first portion of the conductive layer and the second portion of the conductive layer. In some examples, the asymmetry produces a net flow of charge between the first portion and the second portion. In some examples, the asymmetry produces a voltage difference between the first portion and the second portion. In some examples, the asymmetry provides a difference in a zero-point energy density at the first portion of the conductive layer as compared to the zero-point energy density at the second portion of the conductive layer in an absence of the zero-point-energy-density-modifying structure. Optionally, wherein the zero-point-energy-density-modifying structure is a zero-point-energy density-reducing structure.

Optionally, the conductive layer comprises a component of the zero-point-energy-density-modifying structure. The first portion and second portion of the conductive layer can have any suitable arrangement. In some examples, the first portion and the second portion of the conductive layer correspond to laterally adjacent portions of the conductive layer.

In some examples, the zero-point-energy-density-modifying structure comprises a Casimir cavity adjoining the conductive layer. For example, such a Casimir cavity may comprise a first reflective layer; a cavity layer; and a second reflective layer, such as a cavity layer that is between the first reflective layer and the second reflective layer. Optionally, the second reflective layer comprises the first portion of the conductive layer. Optionally, the second reflective layer is adjacent to or in contact with the first portion of the conductive layer.

Optionally, multiple devices can be electrically connected to one another, such as in a laterally adjacent configuration. In some examples, the conductive layer further includes a third portion and a fourth portion, such as where a second zero-point-energy-density-modifying structure adjoins the third portion of the conductive layer. For example, the third portion may be laterally adjacent to the second portion and the fourth portion may be laterally adjacent to the third portion. Alternatively, or in addition, multiple devices can be electrically connected to one another such as in a vertically adjacent configuration. For example, the third portion may be vertically adjacent to the second portion and the fourth portion may be laterally adjacent to the third portion.

Various different materials and geometries can be used for the conductive layer. Optionally, the conductive layer comprises a metal, nichrome, nickel, silver, copper, or graphene. In some examples, the conductive layer comprises a geometric diode or exhibits a geometry characteristic of a geometric diode. In examples, the conductive layer can any suitable thickness, but it will be appreciated that the conductive layer may comprise a thin layer, at least in some examples. Optionally, the conductive layer has a thickness of from 3 nm to 100 nm. In some examples the conductive layer comprises a thickener region, such as a thickener region that extends from the first portion to the second portion. Optionally, the thickener region is present at part of the first portion and at part of the second portion.

Optionally, one or more layers adjacent to or adjoining a zero-point-energy-density-modifying structure (e.g. a Casimir cavity) may have a Seebeck coefficient with a room temperature absolute value of from 1 µV/K to 2000 µV/K or from 1 µV/K to 50 µV/K, such as a conductive layer adjacent to or adjoining a Casimir cavity or an insulator layer adjacent to or within a Casimir cavity. In examples, such layers can have a positive Seebeck coefficient or a negative Seebeck coefficient within these ranges (e.g., from +1 µV/K to +2000 µV/K or from −2000 µV/K to −1 µV/K).

In some examples, different layers having different Seebeck coefficients may be used in the devices of this aspect. For example, the conductive layer may be a first conductive layer having a first Seebeck coefficient of one polarity, and the device may further comprise: a second conductive layer including a third portion and a second portion, such as a second conductive layer that has a second Seebeck coefficient of opposite polarity as the first Seebeck coefficient. The first portion of the first conductive layer and the third portion of the second conductive layer may be in electrical contact with one another. Optionally, the zero-point-energy-density-modifying structure adjoins the third portion of the second conductive layer. As a further example, a device of this aspect may further comprise a third conductive layer having a fifth portion and a sixth portion, such as where the sixth portion of the third conductive layer is in electrical contact with the fourth portion of the second conductive layer. The third conductive layer may a third Seebeck coefficient of opposite polarity as the second Seebeck coefficient. Optionally, a second zero-point-energy-density-modifying structure adjoins the fifth portion of the third conductive layer.

In some cases, the flow of energy that occurs may generate a temperature difference between the first portion of the conductive film and the second portion of the conductive film. Optionally, a device of this aspect may further comprise a voltage source configured to apply a potential difference between the first portion of the conductive layer and the second portion of the conductive layer. In some examples, application of such a potential difference may enhance the temperature difference.

In another aspect, devices comprising transparent conductors are provided. A device of this aspect device may comprising a first electrode, a second electrode, and a Casimir cavity adjoining the first electrode and the second electrode, such as a Casimir cavity in which the cavity layer comprises a transparent conductor. For example, the Casimir cavity may comprise a first reflector (e.g., comprising at least a portion of the first electrode), a second reflector (e.g., comprising at least a portion of the second electrode), and a cavity layer between the first reflector and the second reflector. In some cases, the cavity layer comprises a transparent conductor layer in contact with the second electrode and a transport layer in contact with the first electrode. In examples, the transparent conductor is more electrically conducting than the transport layer.

The devices of this aspect may exhibit a range of geometries. For example, the first electrode may have a thickness of from 5 nm to 1 cm. Optionally, the transparent conductor layer has a thickness of from 10 nm to 2 µm. In some examples, the transport layer has a thickness of from 0.3 nm to 50 nm. Optionally, the second electrode has a thickness of from 5 nm to 1 cm. Optionally, the first conductive layer includes a metamaterial that enhances hot carrier emission.

Various different materials may be used for device components of the devices described herein. In some examples, the transparent conductor comprises a conductive polymer, a doped conductive polymer, a conductive polymer blend, a doped conductive polymer blend, or a transparent conducting oxide, wherein the first electrode or the second electrode comprises a metal, or wherein the transport layer comprises a dielectric, a semiconductor, or a metal oxide. Specific examples include PEDOT:PSS, indium tin oxide (ITO), or indium zinc oxide. In some examples, the cavity layer comprises a material having a transmittance of greater than 20% for at least some wavelengths of light from 100 nm to 10 µm.

As noted above, at least a portion of the first electrode may correspond to or comprise the first reflector of the Casimir cavity and/or at least a portion of the second electrode may correspond to or comprise the second reflector of the Casimir cavity. Optionally, the first reflector comprises the first electrode. Optionally, the second reflector comprises the second electrode. Optionally, the first reflector comprises an interface between the first electrode and the transport layer. Optionally, the second reflector comprises an interface between the second electrode and the transparent conductor. In some examples, a reflectivity of at least one of the first reflector or the second reflector is greater than 50%.

In another aspect cavity transport devices are described herein. In some examples, a device of this aspect comprises a Casimir cavity including a first reflector, a second reflector, and a cavity layer between the first reflector and the second reflector. In some examples, the reflectors are conductive layers or conductive reflectors. An asymmetry between the first reflector and the second reflector or between an optical mode density at an interior of the Casimir cavity and an optical mode density at an exterior of the Casimir cavity may drives a flow of energy at least partially through the Casimir cavity. For example, the flow of energy may be at least partly between the first reflector and the second reflector. In some examples, the flow of energy may be at least partly between the interior of the Casimir cavity and the exterior of the Casimir cavity in a direction parallel to longitudinal axes of the first reflector and the second reflector, such as along a lateral direction perpendicular to a thickness direction of the first reflector or the second reflector.

In some examples, the asymmetry between the first reflector and the second reflector corresponds to one or more of: the first reflector and the second reflector comprising different metals, the first reflector and the second conductive exhibiting different optical photoemission character from one another, or the first reflector including a metamaterial that enhances an optical absorption character of the first reflector as compared to the second reflector. In some examples, the asymmetry is between the optical mode density at the interior of the Casimir cavity and the optical mode density at an exterior of the Casimir cavity. Optionally, the cavity layer includes a transparent conductor positioned to collect charge flowing into the cavity layer from the first reflector or the second reflector.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Quantum vacuum fluctuations fill all space with electromagnetic radiation. The energy density of this radiation in free space is $$\rho(hf) = \frac{8\pi f^2}{c^3}\left(\frac{hf}{\exp(hf/kT)-1} + \frac{hf}{2}\right) \quad \text{Eq. 1}$$

where his Planck's constant, f is the frequency of the radiation, c is the speed of light, k is Boltzmann's constant, and Tis the temperature. The first term in brackets in Eq. 1 is due to thermal blackbody radiation at non-zero temperatures, and the second term is temperature independent and corresponds to the quantum vacuum radiation.

Figure 1:
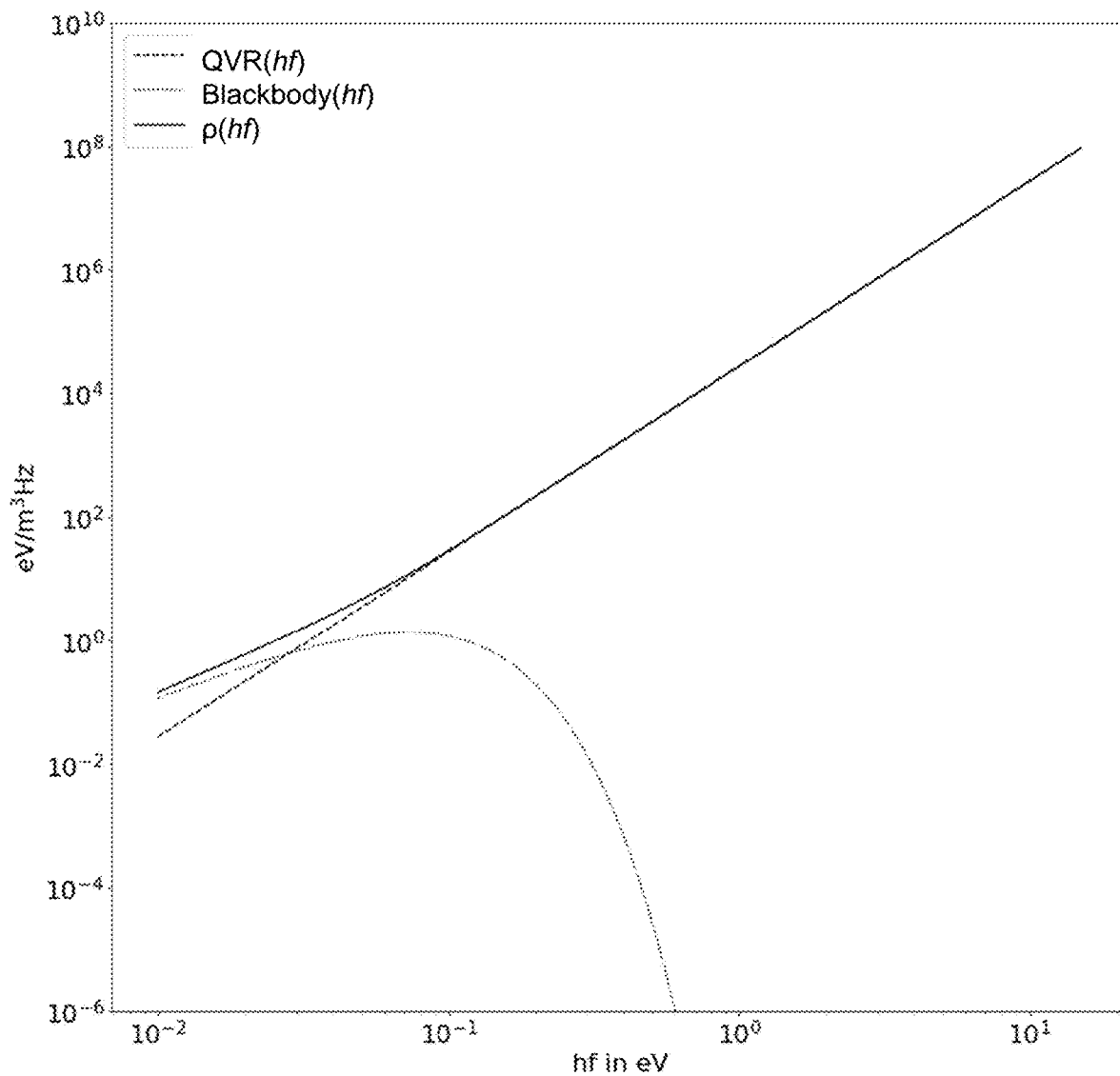
FIG. 1 provides a plot showing energy density spectra for quantum vacuum radiation and blackbody radiation.

The energy density ($\rho(hf)$) spectrum for both the temperature dependent term and the temperature independent term in Eq. 1 is shown in FIG. 1, where the data is plotted as a function of photon energy, hf, where h is Planck's constant and f is optical frequency, which varies with the reciprocal of the wavelength. At 300 K, the thermal component (labeled Blackbody(N) in FIG. 1) reaches its maximum in the infrared through visible parts of the spectrum, whereas the quantum vacuum radiation (labeled QVR(hf) in FIG. 1) component grows with the frequency cubed and becomes much larger than the thermal component of the spectrum at visible light frequencies and beyond (as shown in Eq. 1, above, and Eq. 2, below). For 300 K blackbody radiation, the quantum vacuum radiation component exceeds the thermal part for any frequencies above 7 THz, corresponding to a photon energy of approximately 29 meV. Because the energy density of the quantum vacuum radiation part of the spectrum at high frequencies is much larger than that of the thermal spectrum, much more power may be available from the quantum vacuum radiation.

Harvesting energy arising out of the quantum vacuum radiation does not appear to violate any physical laws, but because the energy corresponds to that of the ground-state, there is generally no driver for the energy to flow. However, the quantum vacuum radiation is geometry dependent, and its density can be different in different regions of space. For example, a zero-point-energy-density-modifying structure can establish a geometric condition where the quantum vacuum radiation density in one region of space can be lower than in free space, such as outside the structure, which, therefore, provides a condition for energy flow to occur. One approach is described in U.S. Pat. No. 7,379,286, which is hereby incorporated by reference.

One example of a zero-point-energy-density-modifying structure is a Casimir cavity, which can be formed using two closely-spaced, parallel reflecting plates. As a result of the requirement that the tangential electric field must vanish (for an ideal reflector) at the boundaries, limits are placed on which quantum vacuum modes (i.e., field patterns) are allowed between the plates. In general, the modes allowed include those where the gap spacing is equal to an integer multiple of half of the wavelength. Modes having wavelengths longer than twice the gap spacing are largely excluded. This results in the full spectrum of quantum vacuum modes exterior to the plates, described by Eq. 1, being larger and more numerous than the constrained set of modes in the interior, and thus there is a lower energy density in the interior. The critical dimension, which determines the wavelength above which quantum vacuum modes are suppressed, is the gap spacing (for the case of a one dimensional Casimir cavity). Casimir cavities can also be constructed in the form of cylinders (nanopores), in which case the critical dimension is the diameter. Casimir cavities may be formed having other geometries as well, which can be used with the disclosed devices. Aspects described herein make use of the fact that the quantum vacuum energy level is dependent upon the local geometry, specifically the presence of a zero-point-energy-density-modifying structure, like a Casimir cavity.

Figure 2:
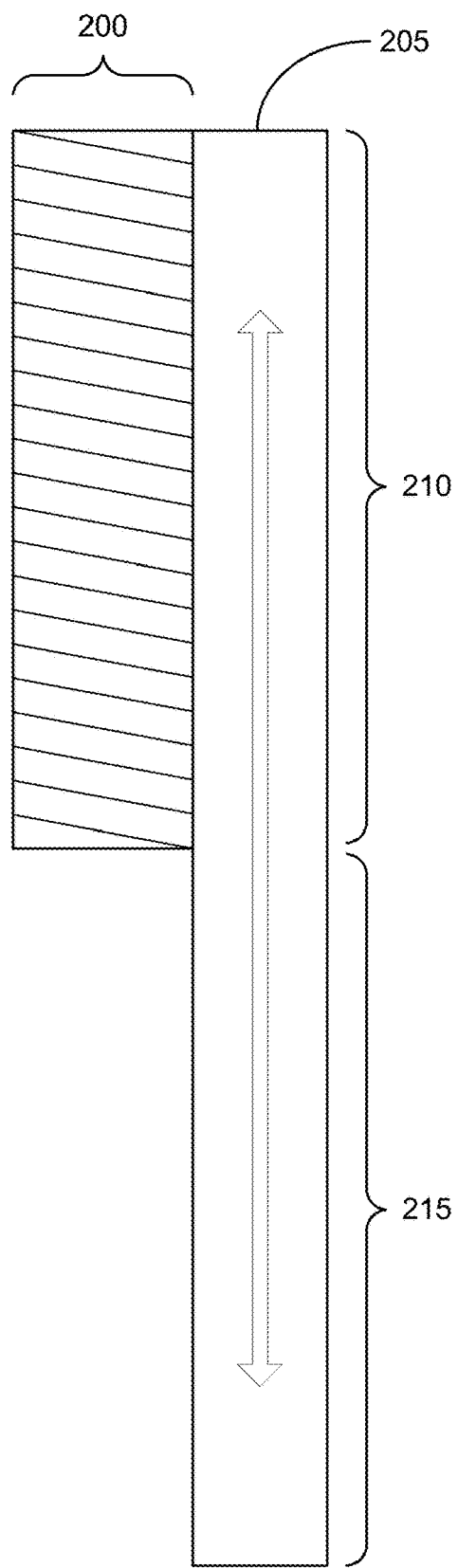
FIG. 2 provides a schematic illustration of an example device driven by an energy density difference, in accordance with at least some embodiments.

Zero-point energy is the ground state energy of a system that remains even at zero temperature. Quantum vacuum fluctuations include zero-point energy fluctuations in the form of electromagnetic radiation. Internal zero-point energy fluctuations also exist in materials that do not support electromagnetic radiation, for example in the form of plasmons. To be able to make use of a difference in zero-point energy densities, an asymmetry with respect to a zero-point-energy-density-modifying structure may be used, allowing a portion of the energy to be harvested. As shown in FIG. 2, a zero-point-energy-density-modifying structure 200 can be used to establish an asymmetry in zero-point energy densities between a first portion 210 of a conductive layer 205 and a second portion 215 of the conductive layer 205, such as by having the first portion 210 of the conductive layer 205 adjoin the zero-point-energy-density-modifying structure 200, for example. By using a structural configuration for producing an asymmetry in the zero-point energy density at one portion of the conductive layer 205 with respect to the other, energy can flow (e.g., as represented by the arrow in FIG. 2) between the second portion 215 of the conductive layer 205, that has no zero-point-energy-density-modifying structure 200, and hence has a first zero-point energy level, and the first portion 210 of the conductive layer with the adjoining zero-point-energy-density-modifying structure 200, which has a second zero point energy density different from the first zero point energy density. The same concept applies if both portions have adjoining zero-point-energy-density-modifying structures, but having different critical dimensions or frequency cutoffs.

Another way to characterize an asymmetry requirement is in terms of equilibrium and detailed balance. In equilibrium, the flow of energy from any first element to any second element must be balanced by an equal energy flow from the second element to the first element. This results from a detailed balance. A zero-point-energy-density-modifying structure can facilitate a means to break this balance, so that there is a different flow of energy from the portion of a conductive layer with an adjoining zero-point-energy-density-modifying structure than from the portion of a conductive without it.

Casimir Cavities.

Figure 3:
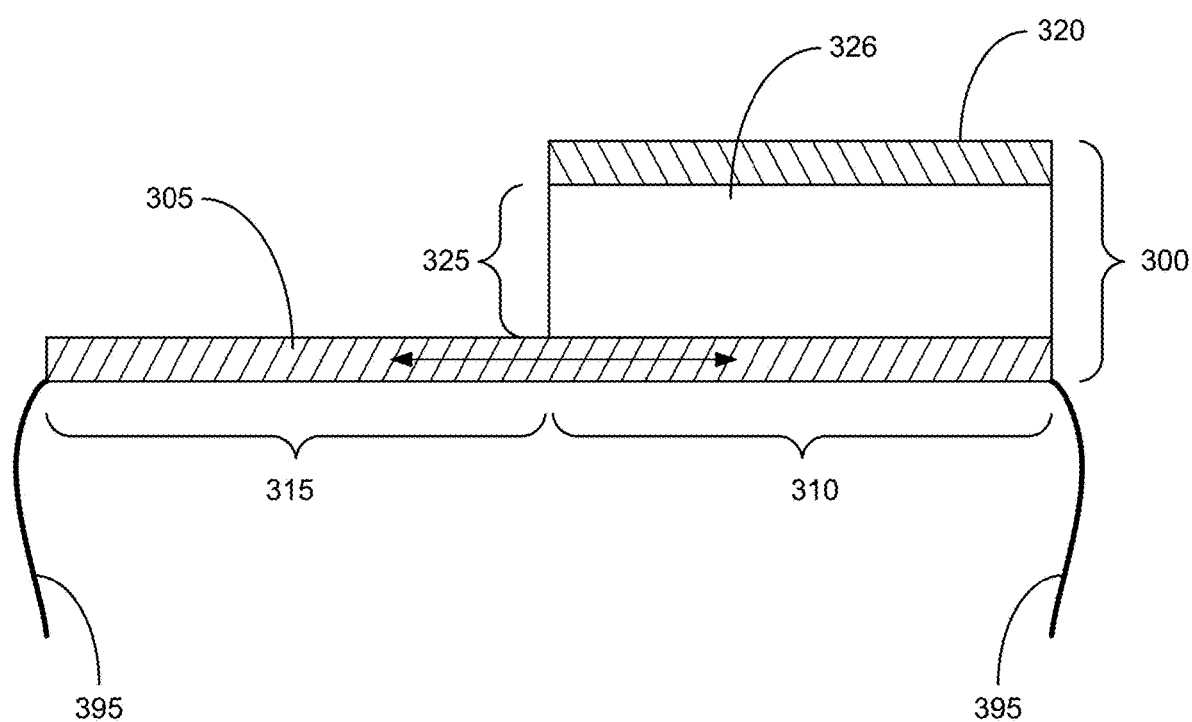
FIG. 3 provides a cross-sectional illustration of an example vacuoelectric device in which a Casimir cavity is partly adjacent to a conductive layer, in accordance with at least some embodiments.

FIG. 3 provides a schematic illustration of an example of a Casimir cavity 300 adjoining a conductive layer 305 at first portion 310 of conductive layer 305, while second portion 315 of conductive layer 305 has no adjoining Casimir cavity. Casimir cavity 300 comprises a first reflector, corresponding to at least a portion of conductive layer 305, a second reflector 320, with a gap 325 between the first reflector and the second reflector 310. Gap 325 (also referred to herein as a cavity layer) may be an empty gap (e.g., evacuated or corresponding to a vacuum) or filled with a gas, which may be achieved with rigid substrates and spacers.

In some embodiments, conductive layer 305 may comprise any suitable conductor, such as a metal or in some cases semiconductors, but conductors with Seebeck coefficients having a room temperature magnitude or absolute value of from 1 μV/K to 2000 μV/K or from 1 μV/K to 50 μV/K may be particularly useful. Example conductors for conductive layer include, but are not limited to, nichrome, nickel, silver, copper, graphene, or hydrogenated amorphous silicon (a-Si:H). In some examples, the conductive layer 305 can have a thickness of from 3 nm to 100 nm. Different regions of the conductive layer 305 can have different thicknesses, in some examples.

In some embodiments, gap 325 may be filled with a material 326, such an at least partially transparent optical material for at least some wavelengths of electromagnetic radiation supported by the Casimir cavity, preferably the entire visible range through the near ultraviolet. In contrast with a gas, material 326 may comprise a condensed-phase material, such as a solid, liquid, or liquid crystal. Example materials useful as a cavity layer include, but are not limited to, silicon oxide or aluminum oxide. Alternatively, it may be sufficient or desirable to fill the gap with a polymer such as PMMA (polymethyl methacrylate), polyimide, polymethyl methacrylate, or silicone, which can provide adequate transparency at wavelengths of interest. In some examples, the material of a cavity layer, such as those materials described above, may have a transmittance of greater than 20% for at least some wavelengths of electromagnetic radiation from 100 nm to 10 μm. Advantageously, the material of a cavity layer may have a transmittance of greater than 50% for at least some wavelengths of electromagnetic radiation from 100 nm to 10 μm. In some cases, the material of the cavity layer, including at least some of the materials described above, may have a transmittance of greater than 70% or greater than 90% for at least some wavelengths of electromagnetic radiation from 100 nm to 10 μm. The thickness or spacing of gap 325 can be set by the target wavelength range for the Casimir cavity. In some examples, the gap 325 of a Casimir cavity can have a spacing of from 10 nm to 2 μm.

The reflector material for second reflector 320 can be chosen based upon its reflectivity over the wavelength range of interest, ease of deposition, and/or other considerations, such as cost. The reflector thickness must be sufficient to provide adequate reflectivity, but not so thick as to be difficult to pattern. In some examples, a reflector can have a thickness of at least 10 nm, such as from 10 nm to 1 cm. Example materials useful as a reflector of a Casimir cavity include, but are not limited to, metals, dielectric reflectors, or diffractive reflectors, such as Bragg reflectors or metamaterial reflectors. Example metals useful for a reflector of a Casimir cavity include, but are not limited to, Al, Ag, Au, Cu, Pd, or Pt. Example dielectrics useful for a dielectric reflector include, but are not limited to $ZrO_2$, $SiO_2$, $Si_3N_4$, $Nb_2O_5$, $TiO_2$, $MgF_2$, LiF, $Na_3AlF_6$, $Ta_2O_5$, $LaTiO_3$, $HfO_2$, ZnS, ZnSe, or the like. Example reflectivity for at least one of the two reflectors of a Casimir cavity is from 50% to 100% for at least some wavelengths of electromagnetic radiation from 100 nm to 10 μm. The reflectors of a Casimir cavity do not have to be metals or dielectric reflectors, and instead a reflective interface may be used. For example, the reflective layer can be a step in the index of refraction at an interface between two adjacent materials, such as between the cavity layer and its surrounding material. In some cases the cavity walls can provide a step in dielectric constant or index of refraction on transitioning from one dielectric material to another one or more, or between a dielectric material and free space.

In some examples, a Casimir cavity may be formed from or using a distributed Bragg reflector type multilayer dielectric stack. For example such a stack can comprise alternating layers of two or more dielectric materials having different indices of refraction. For the case of two types of materials, the thickness of each pair of layers characterizes the pitch. Wavelengths of twice the pitch are reflected, and longer wavelengths are largely suppressed. It is to be noted that this differs from antireflection coatings, in which the pitch is one quarter of a wavelength rather than one half of a wavelength, which is the case here. The layer thicknesses may further be chirped to enhance the spectral width of the reflections. Any suitable number of alternating dielectric layers of can be used, such as from 2 layers to 100 layers, or more. For example, to suppress a wavelength of 250 nm with a stack with alternating layers of $SiO_2$ and $Al_2O_3$, the layer thickness would be 42 nm and 35 nm, respectively. For a total of ten pairs of layers the overall thickness would be 770 nm.

In FIG. 3, a conductive layer 305 is arranged with respect to the Casimir cavity 300 such that a first portion 310 of the conductive layer 305 adjoins the Casimir cavity 300, establishing an asymmetry. Conductive layer 305 can thus have a geometry that permits transmission of energy between first portion 310 and second portion 315, which can be used in a process of harvesting energy via the difference in zero-point energy densities established by the presence of the Casimir cavity 300. Electrical leads 395 can be connected to the conductive layer 305 at first portion 310 and second portion 315 to provide captured energy to an external load. Although electrical leads 395 are illustrated as connected to edges of first portion 310 and second portion 315, this illustration is for example purposes only and is not limiting. Electrical leads 395 may optionally be connected to first portion 310 and second portion 315 at any suitable location. It will be appreciated that, although aspects described herein may be explained by reference to electrons as charge carriers, other charge carriers may be substituted for electrons for various implementations and operations of the disclosed devices, systems, techniques, and methods. Example charge carriers include, but are not limited to electrons, holes, Cooper pairs, any charged species, or magnetic fluxes, such as used in the field of spintronics.

To harvest or capture energy in the form of charge carrier excitation, the charge carrier will need to be transported away from the point at which it is launched and captured. Transport and capture of the charge carrier may need to be performed on very fast (i.e., short) time scales. For example, the transport and/or capture may occur in a time interval of less than or about 1 ps, less than or about 100 fs, less than or about 10 fs, less than or about 1 fs, or less than or about 0.1 fs. In some cases, the longer the time is, the smaller the fraction of energy available will be captured. Description of the need for fast transport and capture of charge carriers is described in further detail below.

Vacuoelectric Device.

In thermoelectric power measured in a thin film, one region is heated compared to another. That causes energetic charge to move from the hot region to the colder, producing a voltage difference between the two. By analogy, if one region of a thin conductive layer is covered with a Casimir cavity (CC) and another not, there will be a reduction in zero-point-fluctuation (ZPF) power in the CC-covered region compared to the uncovered region. Therefore, there will be charge flow of energetic charge from the uncovered region to the covered, producing voltage and current. This is referred to herein as vacuoelectric power, for quantum vacuum power, in contrast to thermoelectric power.

If lost vacuum energy results in lost thermal energy, in addition to supplying power, the devices may become cooler. This effect may be enhanced, in some examples, by applying a voltage in the direction of that being produced, but of greater magnitude.

Various features and configurations may be useful to make this work, such as, but not limited to the following:

The vacuoelectric effect has some similarities to the thermoelectric effect, in that energetic charge carriers transport the energy from or to one region, without the CC, to or from another, with the CC, and in doing so produce a voltage difference between the two regions. Therefore, materials that have a large Seebeck coefficient (SC) can exhibit a large vacuoelectric effect.

The conductive layer may be sufficiently thin for the effect of the CC to penetrate the whole layer; otherwise the part shielded from the CC may short out the voltage.

The energized carriers moving laterally may need to be scattered quickly, assuming that a limitation of $\Delta E \Delta t \sim h/2$ applies. In some examples, graphene may have too long a mean-free path length (MFPL) and scattering time. For example, it may be desirable to use a metal such as Nichrome, Ni, Ag or Cu, which have short MFPLs.

In some examples, the edge of the CC may be sharp compared to the lMFPL of carriers in the conductive layer. For example, fine lithography and use of a material having a long MFPL may be advantageous. Graphene is one example, because of its long lMFPL, but other materials having a lower MFPL may be used.

In some examples, the conductive layer may be formed as one side of the CC. Optionally, the conductive layer may be positioned with a reflector nearby below. Although graphene has a large MFPL, it is a poor reflector. Therefore, if graphene forms one of the reflecting surfaces for a CC, the mode suppression in the CC can be poor, but this can be mitigated by forming a reflecting surface close to the graphene layer (e.g., immediately adjacent to the graphene layer).

Monopolar Vertical Configuration.

In a monopolar vacuoelectric device, one material type is used to form one type of junction, in the form of a single device or in an array.

In some examples, the issue of unintended back-to-back junctions may be addressed. So as not to have a reverse voltage where the CC ends that cancels the voltage produced at the first junction, a thicker conductive region can be used to short out the reverse voltage.

Figure 4:
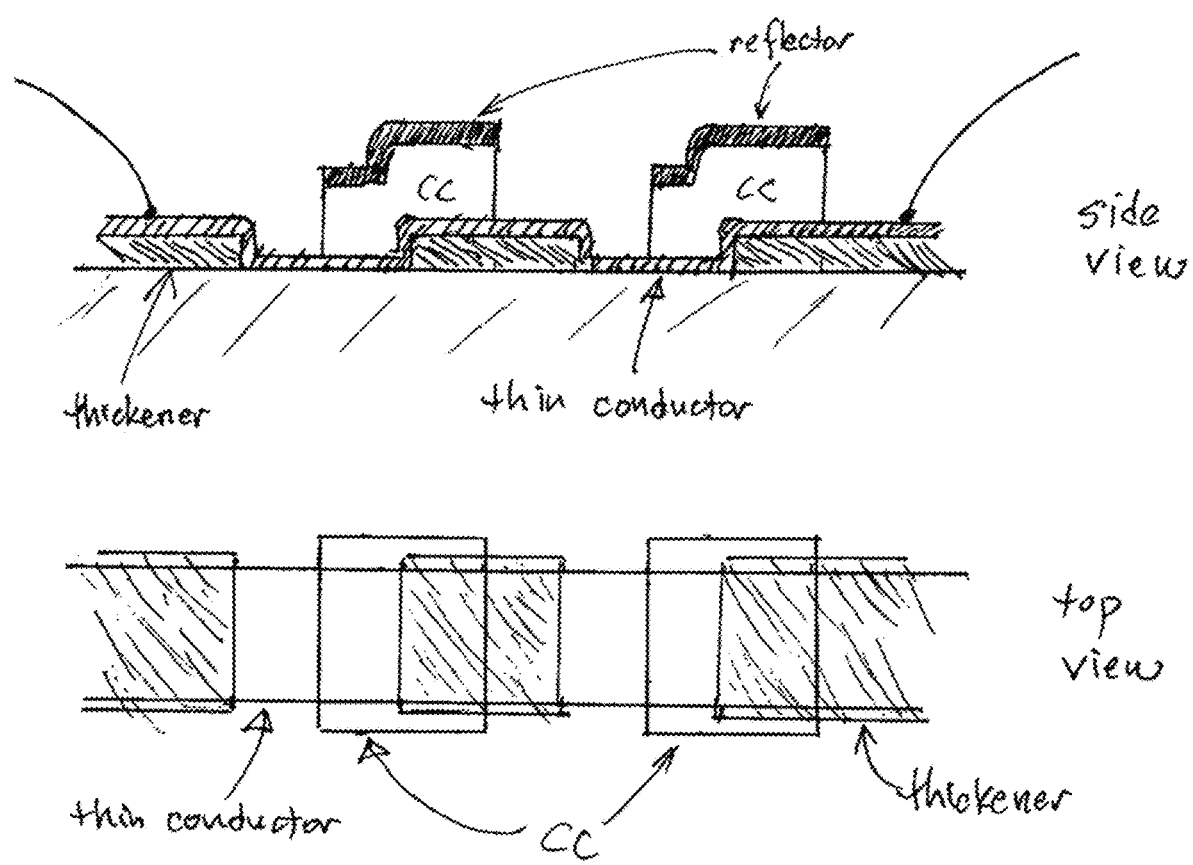
FIG. 4 provides cross-sectional and top view illustrations of example monopolar vertical configuration vacuoelectric devices, in accordance with at least some embodiments.

FIG. 4 shows two monopolar vacuoelectric devices in series. A thicker metal layer, the thickener, is formed underneath one side of the CC to short out the back voltage. Although the thickener is shown in FIG. 4 as a separate component, such configuration is not limiting and it will be appreciated that the thin conductive layer can be a unitary body of a single material of varying thickness, as shown.

Generally materials in which the transport level is at a higher energy than the Fermi level, such as semiconductors, have a higher Seebeck coefficient than materials in which transport takes place at the Fermi level, such as metals. The following materials may be used for monopolar devices:

Nichrome and nickel have fairly large Seebeck coefficients for metals, with an absolute value of approximately 20 μV/K, which is roughly a factor of 20 below that of high-performing semiconductors.

Silver has a relatively long MFPL, which may be advantageous in some examples. In the roughly 10 nm thickness that is required to avoid having the lower region of the layer short out the upper region, the layer can oxidize quickly in atmosphere. A 10 nm thick silver layer can optionally be coated with titanium (2 nm) to protect it.

Semiconductors have large Seebeck coefficients but have two characteristics that may be undesirable in this application: (i) a long scattering time, and (ii) usually formed as a bulk rather than thin film. One material that is an exception is hydrogenated amorphous silicon (a-Si:H), which is produced as a thin film and can have a very large Seebeck coefficient, up to approximately 1000 μV/K, with sub-picosecond scattering times. Also, silicon-on-insulator (SOI) wafers can provide the advantages of the large Seebeck coefficient of semiconductors in a thin structure. Insulators have large Seebeck coefficients and can produce large vacuoelectric voltages.

Graphene can be induced to have a bandgap, which can enhance the Seebeck coefficient. Also, multilayer graphene and periodic metallic structure can increase the size of the effect. The poor reflectivity of graphene, which results in a poorly performing CC, can be somewhat mitigated with multilayer graphene. The reason for putting down the thickener first is to process the thin film as little as possible. If graphene is used instead of a metal layer, then the thickener may be above it rather than below, because such a configuration may make it easier to lay down the graphene, and graphene will not oxidize as easily as many metals.

Bipolar Vertical Configuration.

Figure 5:
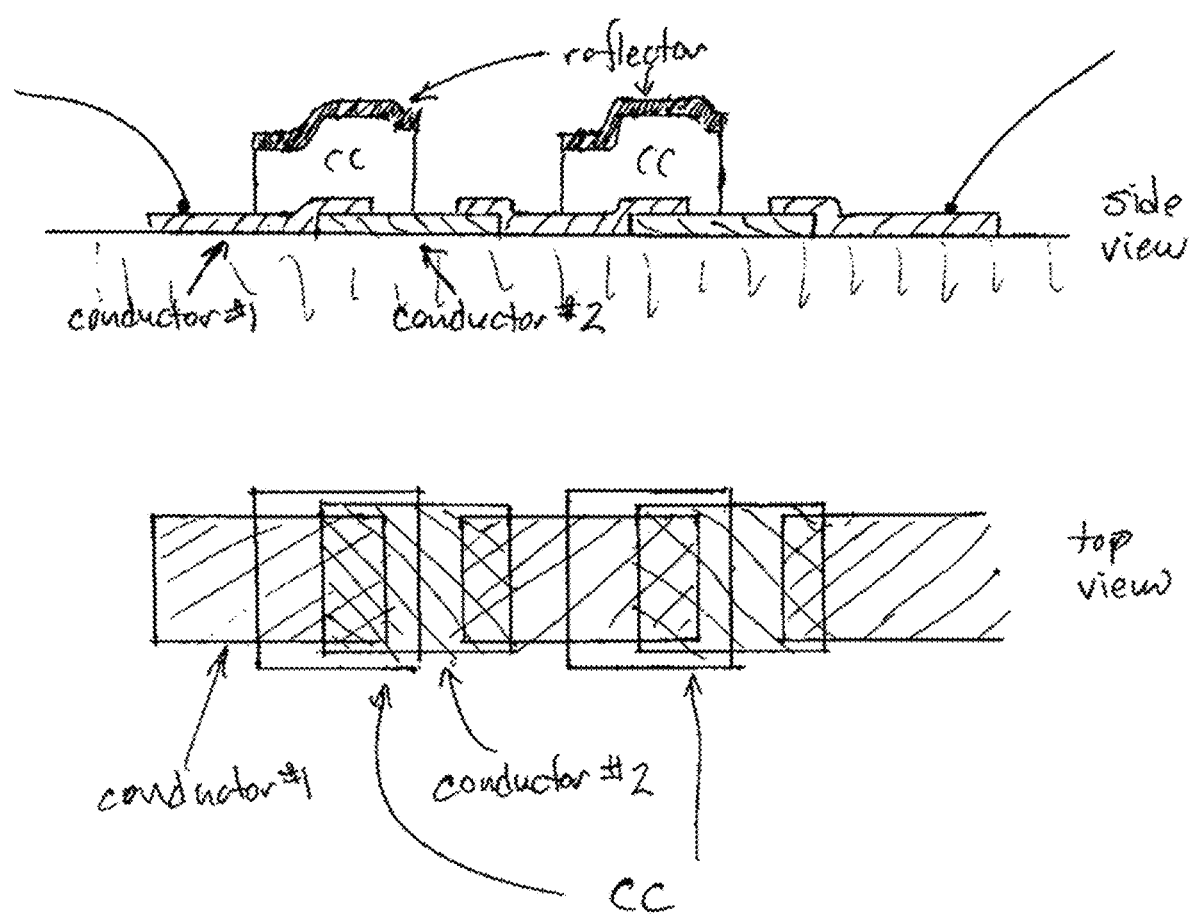
FIG. 5 provides cross-sectional and top view illustration of example bipolar vertical configuration vacuoelectric devices, in accordance with at least some embodiments.

With the monopolar configuration described above, one of the two sides of the CC may be shorted out so as not to form a back voltage. A more efficient way to resolve this issue is to form a bipolar device in which the material under once side of the CC has a positive Seebeck coefficient and the material under the other side has a negative one. Such a bipolar configuration is depicted in the FIG. 5. For example, a device can be formed between Nichrome, which has a relative Seebeck coefficient of 25 μV/K, and nickel, which has a relative Seebeck coefficient of −15 μV/K. Given that Pt has an absolute Seebeck coefficient of about −5 μV/K, that means that the absolute Seebeck coefficients of Nichrome and nickel are approximately 20 and −20 μV/K, respectively. Nichrome oxide is about 4 nm thick after heating to a high temperature. (For room temperature films below 19 nm the resistivity increases substantially.) As a zero band-gap material, pristine graphene has a small Seebeck coefficient, but its Seebeck coefficient can be modified by effectively doping it.

Parallel-Plane Configuration.

Figure 6:
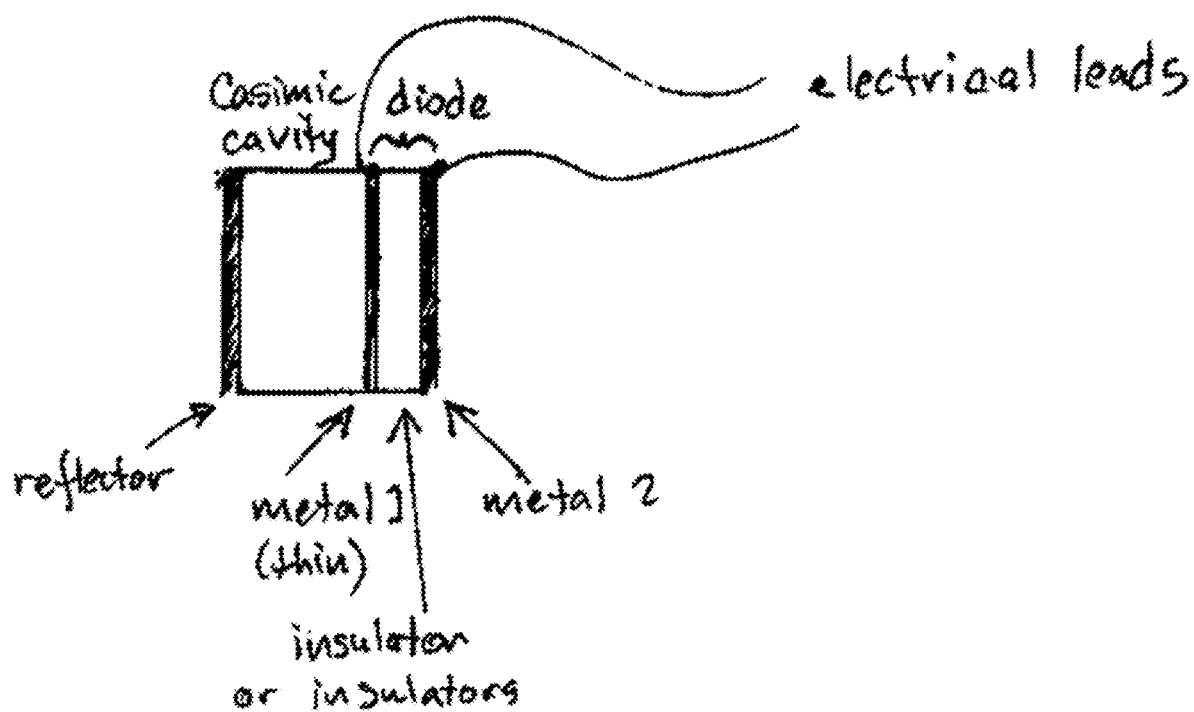
FIG. 6 provides a cross-sectional illustration of an example parallel plane configuration device, in accordance with at least some embodiments.

In addition to the vertical devices described above, the vacuoelectric device can be made in the form of parallel-plane devices. Such a configuration has an advantage that a much larger area can be used to produce the current. In some examples, a parallel-plane configuration vacuoelectric device can be in the format of the photoinjector devices described in U.S. patent application Ser. No. 16/855,890), and shown in FIG. 6. A parallel-plane vacuoelectric device can also be formed with a transparent conductor, described in further detail below, and shown in FIG. 7. Other permutations of the devices also apply, such as the inverted structures, and the double CC devices with the CCs having different thicknesses.

Combined with Asymmetric Structure.

Figure 8:
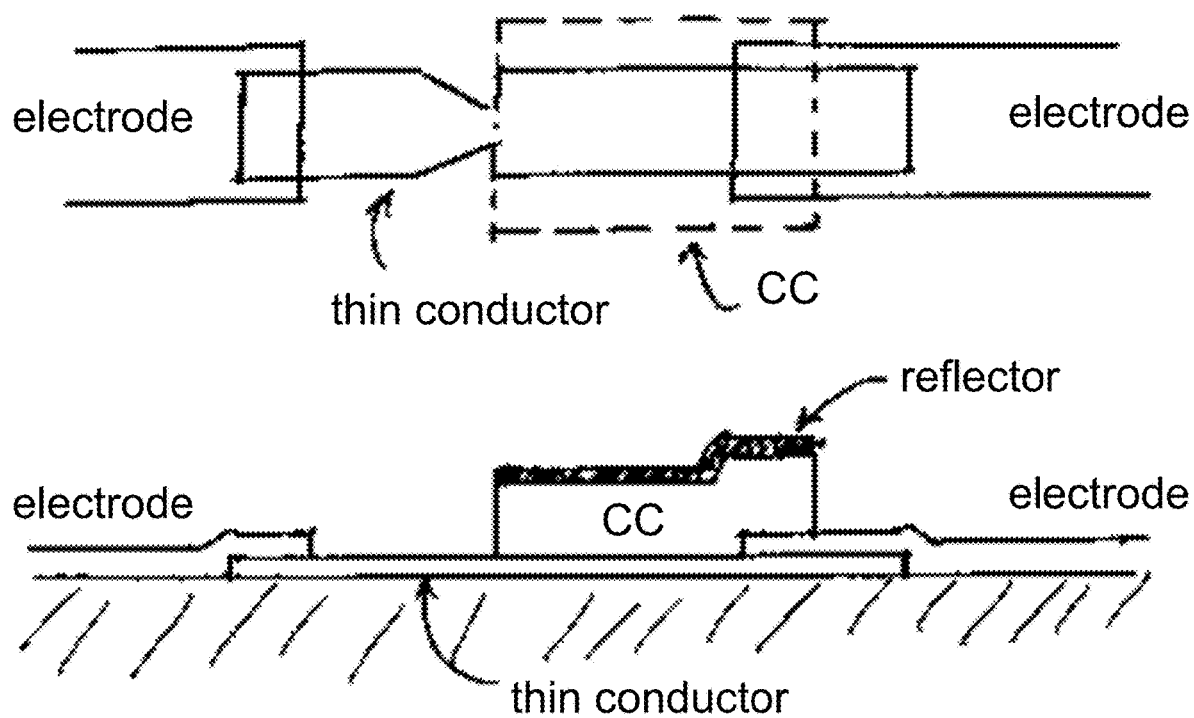
FIG. 8 provides cross-sectional and top view illustration of an example geometric diode configuration vacuoelectric device, in accordance with at least some embodiments.

Another way to make use of the vacuoelectric effect is in conjunction with a geometrically asymmetric structure. An example of such an asymmetric structure is a geometric diode, which comprises a thin conductor formed into an asymmetric structure such that charge carriers move preferentially in one direction over another. In examples, the thin conductor can be graphene. The geometry is what produces the asymmetric, diode-like, electrical characteristics. The top panel of FIG. 8 depicts the top view of a geometric diode with additional structures to provide a vacuoelectric effect. An arrowhead type of shape is formed that allows charges to be funneled preferentially to the right, under an applied field and largely blocked when the driven in the other direction under an applied field of the opposite direction. U.S. Pat. No. 8,803,340, hereby incorporated by reference, describes general details of a geometric diode.

A CC is formed over one half of the geometric diode such that it reduces the concentration of energetic charge on the right hand side, with respect to the concentration on the left hand side. This can provide a net flow of charge from the left to the right even in the absence of an applied field. Furthermore, in the presence of an applied field, it can enhance the geometric effect, and increase the electrical asymmetry to the device.

Electrodes, which may be thin metal layers, provide electrical contact and also short out any reverse voltage formed at the right edge of the CC. The bottom panel of FIG. 8 shows an edge view of the same structure.

Difference Between Vacuoelectric Effect and the Thermoelectric Effect.

Given the similarity between the vacuoelectric effect and the Seebeck effect, the vacuoelectric voltage can be defined:

$$V_V = S \Delta Tz$$

where Tz is an effective zero-point energy temperature, which is determined by the mode reduction in the CC. The $\Delta Tz$ is the difference between Tz inside and outside a CC, or between two CCs having different thicknesses, and S is the Seebeck coefficient. (Note that this equation can alternatively serve as a definition of $T_Z$.) Since the $T_Z$ varies strongly with CC thickness, a change in $V_V$ with CC thickness can be observed. The $V_T$ (conventional thermoelectric voltage) varies directly with $\Delta T$, and so if the measured voltage is independent of CC thickness, it is unlikely that the effect is due to the vacuoelectric effect, but is instead a conventional thermoelectric voltage.

Another difference has to do with the available current. In the thermoelectric effect, the measured current is limited by the resistance of the device and temperature difference. In the vacuoelectric effect, the current is limited by the resistance and vacuum Tz difference. Because of the limited dimensions of the Casimir and the optical properties of the materials involved, the Tz difference is limited, and this can significantly limit the current.

The voltage for the thermoelectric effect is related to the Seebeck coefficient, and depends on the heat carried per charge carrier and in a metal is proportional to the specific heat. The maximum voltage for a given material depends on the temperature difference. Similarly, the voltage for the vacuoelectric effect depends on the Tz difference. That difference is limited by the dimensions of the Casimir and the optical properties of the materials involved. The available current is related to the device resistance. This relationship between the voltage, current and resistance determines the power available.

Transparent Conductive Casimir Cavity Photoinjector.

One limitation with the metal/insulator/metal (MIM) Casimir cavity (CC) photoinjector device is that the CC photons impinge on the thin metal on one side, such that the photoexcited hot charge carriers (usually electrons) must traverse the metal to be injected into the transport layer. The configuration depicted in FIG. 7 provides a simplified device that relieves the hot electrons from having to traverse the metal layer.

Figure 7:
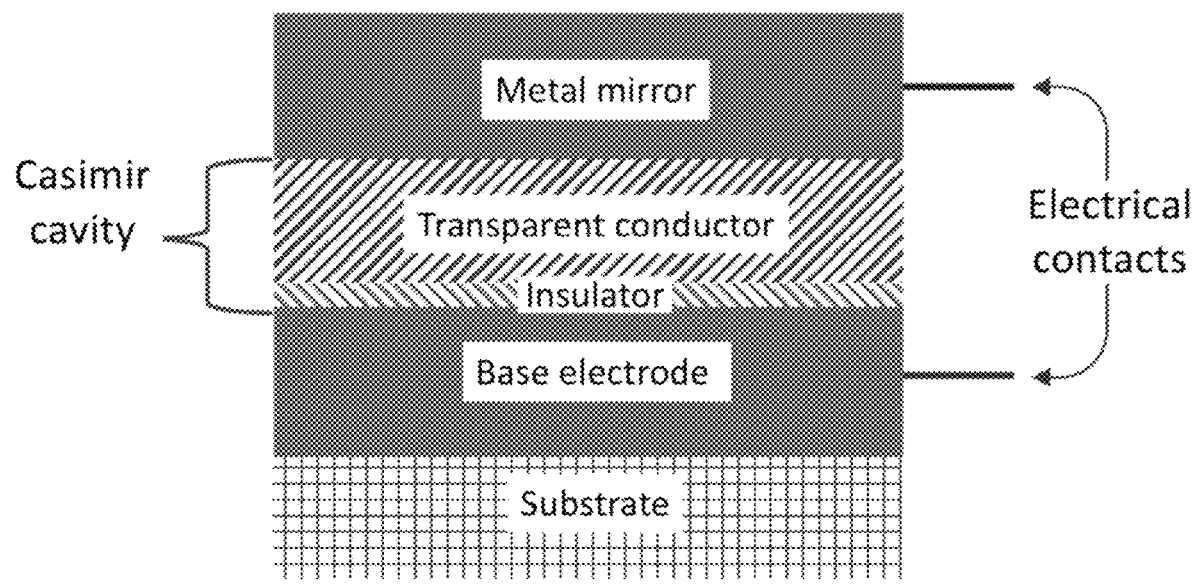
FIG. 7 provides a cross-sectional illustration of an example transparent conductive Casimir photoinjector device, in accordance with at least some embodiments.

In the example structure shown in FIG. 7, the MIM structure is replaced with a base electrode/insulator/transparent-conductor structure. The CC is formed between the base electrode and an upper metal mirror, with the transparent conductor forming much of the optically transparent medium of the cavity. Example materials are nickel for the base electrode, nickel oxide for the insulator, PEDOT:PSS for the transparent conductor, and aluminum for the mirror, but many materials could be substituted for these.

The CC is formed in the transparent conductor (TC), and the cavity photons impinge on the thick metal (e.g., the base electrode) to produce hot electrons. Those hot electrons traverse the transport layer and are scattered/absorbed in the TC. In that way, the hot electron injection takes place on the same side where the absorption takes place, and they are formed closer to the surface and absorbed more strongly because the metal is thick.

In examples when the TC is a polymer like PEDOT:PSS, it can be spun on quite thinly to form the CC. Such material will make electrical contact to the reflector, which may be the top electrode; the thick metal forms the other electrode. Previous generation photoinjector devices based on MIM structures tend to degrade over time, possibly due to pinhole formation. Advantageously, polymers, such as PEDOT:PSS, and conductive oxides may be more forgiving than metal electrodes, and less likely to be shorted out by small pinholes. Transparent conductive oxides include ITO and doped zinc oxide.

In some examples, PEDOT:PSS may exhibit have a relatively lower density of electrons that scatter the incoming hot electron, so that the hot electron path is longer and slower, which can reduce the efficiency. To counteract such a phenomenon, examples may use doped PEDOT:PSS to have more free electrons.

Cavity Transport Device.

In an aspect, this disclosure describes an alternative to the Casimir photoinjector to provide a similar function. With the Casimir photoinjector, the electrical device though which excited charge flows is adjacent to a CC. With the cavity transport device disclosed herein, the excited charge flows through the CC itself.

A CC that is sufficiently thin or which includes a medium that supports excited charge transport can support a current. For example, such a device could be a MIM device. In such a device the metal layers can serve as optical mirrors or as one component of the optical mirrors that form the CC. The quantum vacuum optical mode density inside the cavity is lower than the quantum vacuum optical mode density outside because of the suppression of modes due to the optical resonance induced by the cavity walls, which function as mirrors. Therefore there is a reduced optical mode density impinging on the inner surfaces of each cavity wall as compared to the outer surfaces. This results in a net flow of photoinjected charge from the outer surfaces to the inner surfaces. There is no net flow of charge from one metal layer to the other because of the symmetric structure; the net flow of charge inward from one mirror is balanced by the net flow of charge inward from the opposite mirror.

Figure 9A:
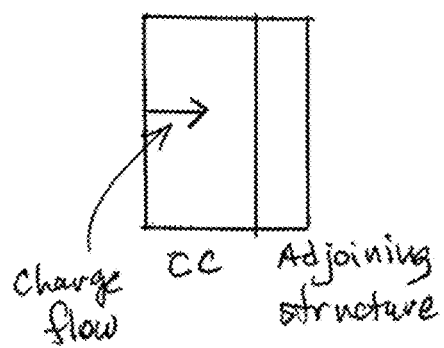
FIG. 9A, FIG. 9B, FIG. 9C, FIG. 9D, FIG. 9E, and FIG. 9F provide cross-sectional illustrations of example cavity transport devices, in accordance with at least some embodiments.
Figure 9D:
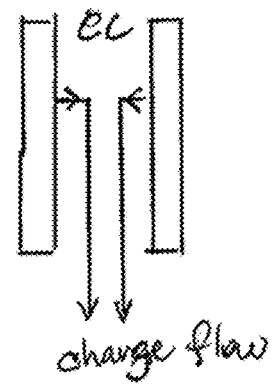
Figure 9B:
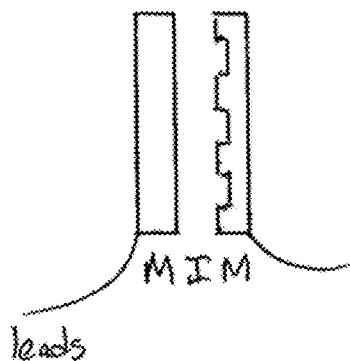
Figure 9E:
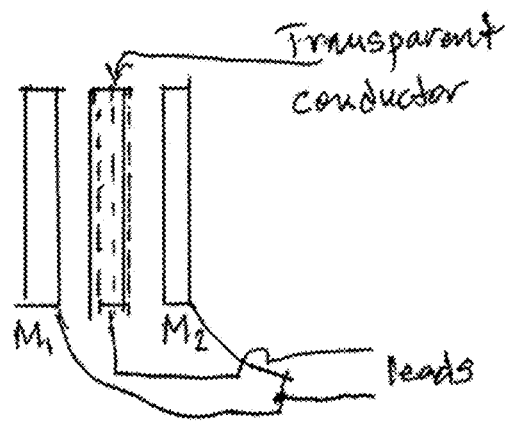
Figure 9C:
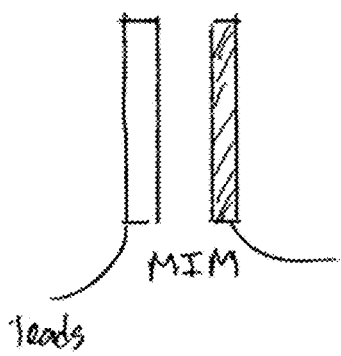

One type of driver for the charge flow is an asymmetry with respect to the CC. Such a configuration is depicted in FIG. 9A, which shows a CC with an adjoining structure that produces a significant asymmetry. Further, this CC supports the flow of charge at least partially through the cavity. An example of such a structure is a CC forming an asymmetric MIM structure in which one of metal layers is different from the other, as depicted in FIG. 9B. This difference results in a different photoemission yield from the two metal layers. One way to accomplish this is if one metal layer is electrically different from the other, such that emits or absorbs electrical charge carriers differently from the other metal layer. It could have a different barrier height, or support a different plasmonic modes structure, etc. It could have a structural difference to induce this different electrical difference, for example by forming a metasurface. Alternatively, one metal layer could have a different optical character than the other metal surface, as depicted in FIG. 9C, such that it absorbs, reflects or transmits the impinging optical modes differently.

Figure 9F:
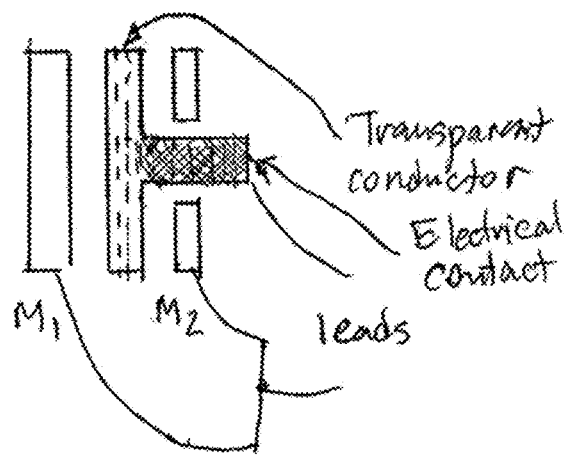

Besides having an asymmetry, another driver for the flow of charge is the difference in the optical mode density inside and outside of the cavity. FIG. 9D depicts a CC device in which the quantum vacuum mode density is different in the inside from what it is on the outside. Further, this CC supports the flow of charge at least partially through the cavity in a direction parallel to the cavity walls. Further, the structure provides a means to collect at least some of the charge that flows at least partially through the cavity. FIG. 9E depicts a specific embodiment, in which there is a transparent conductor in the interior of the Casmir cavity. This transparent conductor does not block the optical modes, but can collect injected charge flowing from at least one of the outer metal layers. The return lead for this device is connected to one or both of the outer metal layers, $M_1$ and $M_2$. This charge flow produces a current that provides power to an external element or device. FIG. 9F depicts a different edge view of the same device, in which the device is rotated by 90° to reveal an electrical contact to the interior transparent conductor. It shows a gap in $M_2$ through which the contact material, e.g., a metal, protrudes so that an electrical connection can be made to it. The $M_2$ layer is contiguous in other regions where the transparent conductor does not protrude through.

Nonuniform-Thickness Cavity Device.

Figure 10A:
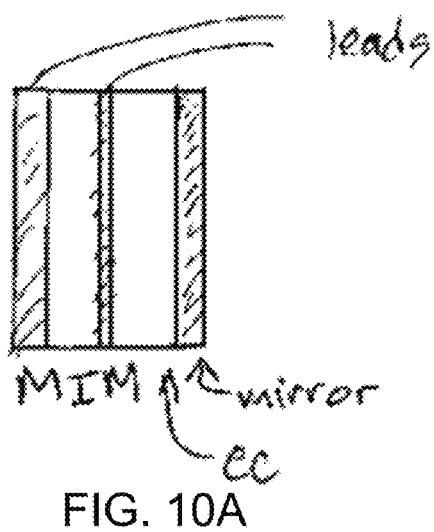
FIG. 10A, FIG. 10B, FIG. 10C, FIG. 10D, FIG. 10E, and FIG. 10F provide cross-sectional illustrations of example non-uniform thickness cavity devices, in accordance with at least some embodiments.

In the photoinjection devices described above, the thickness of the layers is largely constant. An example is shown in FIG. 10A, which illustrates a MIM structure adjoining a CC. The electrical power is extracted between the two metal layers of the MIM device, due to a voltage that is generated across the insulator. By instead varying the thickness of one or more of the layers, a voltage can be induced along the layers, not just across them. This provides an additional means to generate power.

Figure 10B:
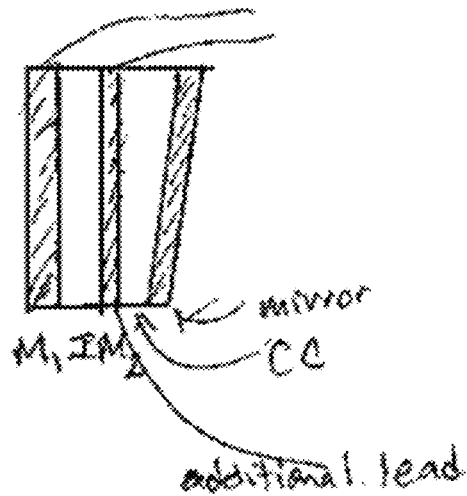

FIG. 10B depicts a similar structure, but where the thickness of the CC is varied. Because of this variation, more optical modes are suppressed in the thinner region than in the thicker region, which causes more charge to be injected in across the thinner region than across the thicker one. That results in a voltage change in the vertical direction. If the injected charge is electrons, then more electrons will be injected from the $M_1$ to $M_2$ of the MIM device in the thin region than in the thick. That will result in a lower (more negative) voltage at the lower end of the $M_2$ region than at the upper end. Therefore a voltage is produced along the $M_2$ layer such that power may be obtained between the upper and lower leads going to $M_2$, not just between $M_1$ and $M_2$.

Figure 10C:
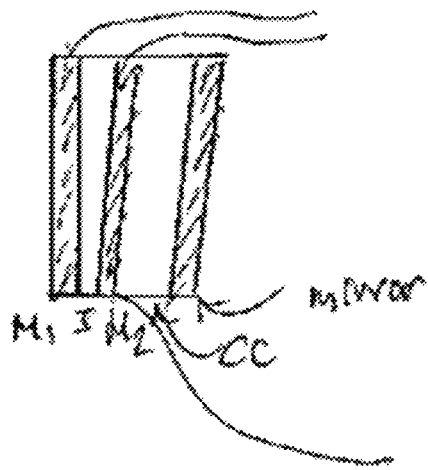

FIG. 10C depicts a similar structure, but where the thickness of the CC is constant, but the thickness of the insulator is varied. This results in more electron transport in the thin-insulator part of the MIM diode than in the thicker part. As in the case of the nonuniform-thickness CC device depicted in FIG. 10B, this too results in a voltage produced along the $M_2$ layer, such that power may be obtained between the upper and lower leads going to $M_2$, not just between $M_1$ and $M_2$.

Figure 10D:
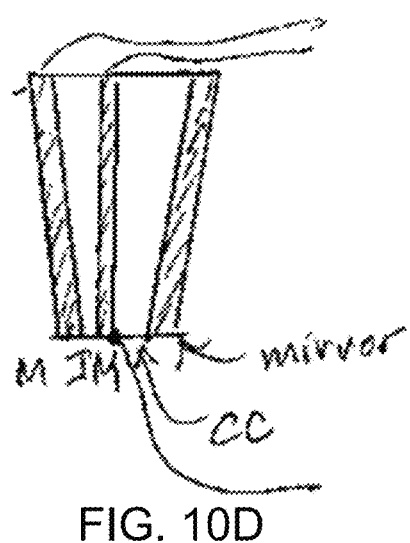
Figure 10E:
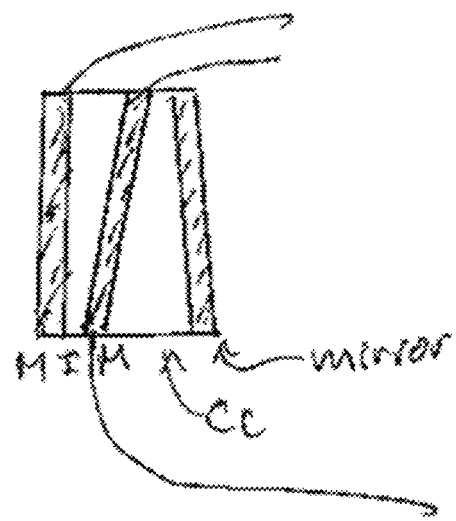
Figure 10F:
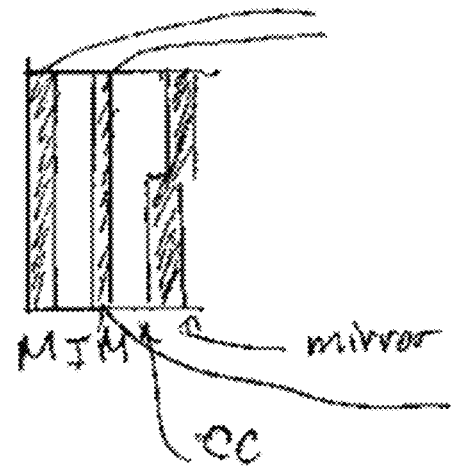

Both the CC thickness and the MIM diode thickness can be nonuniform, as depicted in FIG. 10D and FIG. 10E, which can augment the effect. Further, the nonuniformity can be stepped, as shown in FIG. 10F, and many other shapes.

Although the term metal is used with reference to MIM devices herein, it will be appreciated that any suitable conductive material may be used in place of metals in MIM devices (e.g., in the form of a conductor-insulator-conductor device). Example conductive materials include, but are not limited to metals, semiconductors, two-dimensional conductive materials, superconductors, conductive ceramics, or conductive polymers.

Aspects of the invention may be further understood by reference to the following, non-limiting examples.

EXAMPLE 1: OPTICAL-CAVITY-INDUCED CURRENT

The formation of a submicron optical cavity on one side of a metal/insulator/metal (MIM) tunneling device induces a measurable electrical current between the two metal layers with no applied voltage. Reducing the cavity thickness increases the measured current. Eight types of tests were carried out to determine whether the output could be due to experimental artifacts. All gave negative results, supporting the conclusion that the observed electrical output is genuinely produced by the device. These results are interpreted as being due to the suppression of vacuum optical modes by the optical cavity on one side of the MIM device, which upsets a balance in the injection of electrons excited by zero-point fluctuations. This interpretation is in accord with observed changes in electrical output as other device parameters are varied. A feature of the MIM devices is their femtosecond-fast transport and scattering times for hot charge carriers. The fast capture in these devices is consistent with a model in which an energy $\Delta E$ may be accessed from zero-point fluctuations for a time $\Delta t$, following a $\Delta E \Delta t$ uncertainty-principle-like relation governing the process.

Introduction.

Metal-insulator-metal (MIM) tunnel diodes have been used to provide rectification and nonlinearity for a variety of applications. The insulator forms a barrier that charge carriers—electrons or holes—must cross to provide current upon applying a voltage across the device. In addition, current can be produced by the direct absorption of light on one of the metal surfaces of an MIM sandwich structure, which generates hot carriers that cross the metal and are injected into the insulator. This internal photoemission is also called photoinjection. For current to be provided, the metal layer must be thinner than the hot-carrier mean-free path length so that the carriers can cross it without being scattered. Once they reach the insulator, the hot carriers must have sufficient energy to surmount the energy barrier at the interface and traverse the insulator ballistically above its conduction band edge, or alternatively they can tunnel through the insulator. Thinner insulators favor tunneling. After entering the metal base electrode on the other side, the hot carriers are scattered and captured.

MIM diodes have been designed and fabricated for ultra-high speed rectification. Incorporating a thin optical resonator used as an optical cavity on one side of the MIM structure induces a reduction in the device conductivity measured over a range of several tenths of a volt. At lower, sub-millivolt voltages a persistent induced current and voltage is evident, which is described here. Trends in current output are observed as the thicknesses of the optical and electrical layers in the device are varied. A photoinjection model may explain what could produce the observed output, in which hot carriers are excited by the quantum vacuum field.

Figure 11:
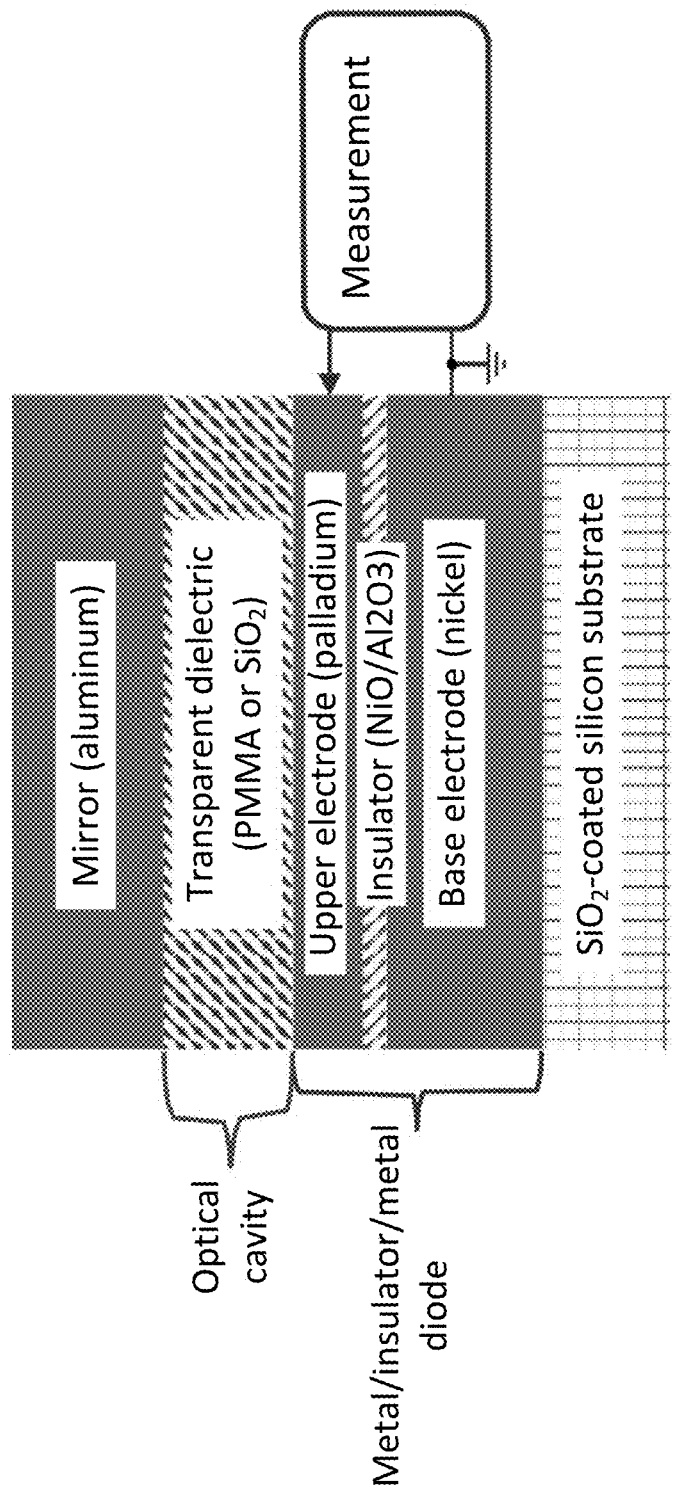
FIG. 11 provides a cross-sectional illustration of an example Casimir cavity photoinjector device, in accordance with at least some embodiments.

The devices comprise thin optical cavities deposited over MIM structures, as depicted in FIG. 11. The cavity thickness is in the range of tens of nanometers up to approximately 1 μm, which results in a cavity optical mode density with a wavelength dependence described by an Airy function. This cavity largely suppresses wavelengths longer than twice the cavity thickness multiplied by the refractive index of the transparent dielectric. For the devices described, the resulting wavelength cutoff, above which modes are suppressed, varies from the near-infrared through the near-ultraviolet, depending on the cavity thickness. The MIM structures include a nanometer-thick insulator to form the barrier. The upper electrode is sufficiently thin to allow hot carriers that are photoexcited on the optical cavity side of the electrode to penetrate the electrode and reach the insulator without being scattered.

Figure 12A:
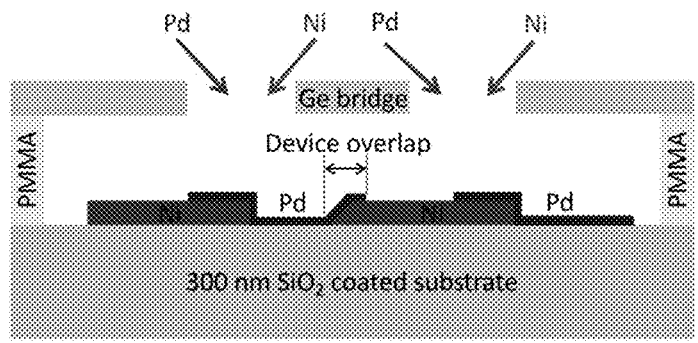
FIG. 12A provides an illustration showing a cross-sectional view of a layout of materials for a Casimir cavity photoinjector device.
Figure 12B:
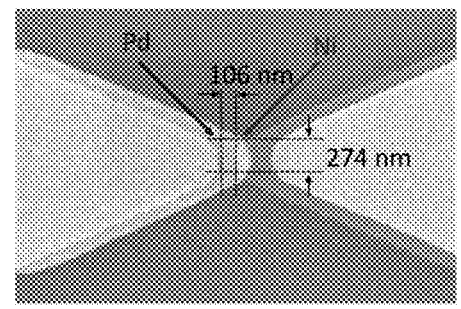
FIG. 12B provides a scanning electron microscope image of a Casimir cavity photoinjector device.

Materials and Methods:

Device Fabrication. Two different processes were used to form the devices. Submicron devices were fabricated using a germanium shadow-mask (GSM) process. Using a deep-ultraviolet stepper, a 250 nm wide germanium bridge is formed over an $SiO_2$-coated surface of a silicon wafer, as depicted in FIG. 12A. First the nickel base electrode is evaporated under the bridge from one side. This is followed by native $NiO_x$ growth at room temperature, and then by conformal $Al_2O_3$ deposited by sputtering. After the insulator is formed, the palladium upper electrode is evaporated from the opposite side. The resulting overlap of the two metals forms an ellipse with an area of $0.02 \pm 0.006$ μm$^2$, as shown in FIG. 12B. After the germanium bridge is removed, a transparent dielectric, spun-on polymethyl methacrylate (PMMA) or sputtered $SiO_2$, is deposited to form an optical cavity over the MIM structure. The dielectric layer is then coated with an aluminum mirror. In addition to providing a reduced density of optical modes, the optical cavity encapsulates and stabilizes the MIM structure, blocking further oxidation. (Note that the use of PMMA to support the germanium bridge, as shown in FIG. 12A, is independent of whether PMMA is also used in a subsequent layer to form an optical cavity.)

Figure 13:
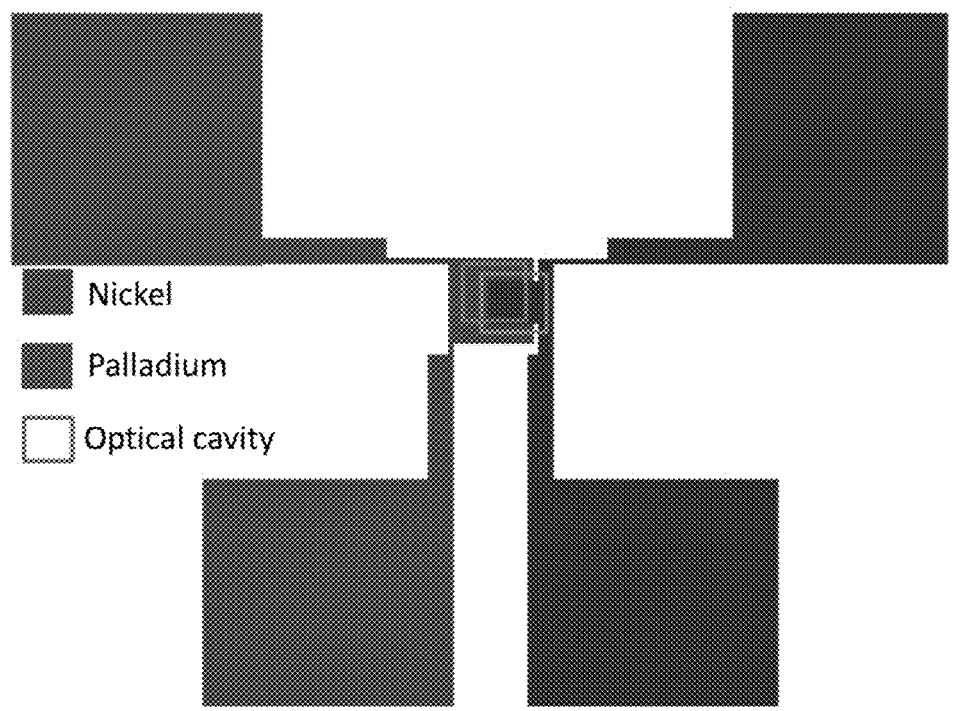
FIG. 13 provides an illustration showing a top layout view of materials for another Casimir cavity photoinjector device prepared using photolithography techniques.

Additional devices, having larger areas, were fabricated using standard photolithographic techniques. The top view of one of these devices is shown in FIG. 13.

The thicknesses and refractive indices of most of the dielectric layers were determined by UV-Vis-NIR variable angle spectroscopic ellipsometry (VASE) measurements. The measured refractive indices for the spun-on PMMA and deposited $SiO_2$ are 1.52 and 1.49, respectively, at a wavelength of 300 nm. The $Al_2O_3$ thickness values were measured by VASE on silicon witness samples that were placed in the sputtering system along with the devices. For the photolithographic devices, the native $NiO_x$ thickness was also measured by VASE and found to be 2.3 nm. In addition, a monolayer (0.4 nm) of photoresist remained over the $NiO_x$ layer in the photolithographic devices. (The reason is that after depositing the insulator and patterning the upper electrode using a liftoff process, the standard oxygen plasma could not be used to clean residual photoresist off the insulator surface without further oxidizing the insulator, with the result that the devices become too resistive.) For GSM devices the patterning was accomplished by the shadow-mask deposition depicted in FIG. 12A, and so no photoresist was required. Because the thickness of the native $NiO_x$ insulator in the GSM MIM structures could not be measured directly, its effective thickness was determined from electrical measurements and simulations of Ni/native $NiO_x$/Pd structures. A $NiO_x$ thicknesses of 0.6-1 nm was extracted for effective barrier heights in the range of 0.06-0.08 eV. The barrier height was calculated by performing Fowler-Nordheim analysis on a low resistance (~100Ω) device with nonlinear current-voltage characteristics. The native $NiO_x$ thickness for GSM structures is smaller than that for the photolithographic devices because of the higher processing temperatures for the photolithographic devices, and possibly because the junctions in GSM structures were partially protected by the germanium bridge. The total effective insulator thickness for the $Al_2O_3$/$NiO_x$ combination is the sum of the thickness values for each layer. Thickness values for the Ni base electrodes are 38 nm for the GSM devices, and 50 nm for the photolithographic devices. The aluminum mirror is 150 nm thick for all devices.

Device Measurement.

Once the MIM structures were fabricated, current-voltage (I(V)) measurements were carried out using a four-point probe configuration to circumvent the effects of lead resistance. A high precision Keithley 2612 source meter (calibrated to NIST standards) was used to source either voltage or current across two pads, and an HP 3478A digital multimeter (DMM) was used to measure the voltage drop across the MIM junctions.

Although the standard technique is to source a voltage and measure the current using the source meter, this can result in erroneous offsets for low resistance devices, e.g., for currents on the order of 1 nA through a device having a resistance less than 1 MΩ. Therefore, some of the measurements were carried out, particularly for low-resistance devices, by sourcing the current (±0.06%±100 pA accuracy) and measuring the voltage. To eliminate any effects due to thermoelectric potentials resulting from a temperature difference between the source meter and the probes, a current reversal method was used. Following this method, two measurements with currents of opposite polarity were performed, one when the base electrode was grounded, another when the upper electrode was grounded, and then subtracted the difference in the currents to yield the final value.

In fabricating and testing tens of thousands of MIM devices, a wide range of resistances have been generally found for nominally the same fabrication conditions due to slight uncontrollable variations in the insulator thickness, which is fewer than 10 lattice constants thick. In most cases the measurement results presented are averages across each wafer chip, with error bars showing the standard deviation.

Results: Electrical Response Measurements.

Figure 14A:
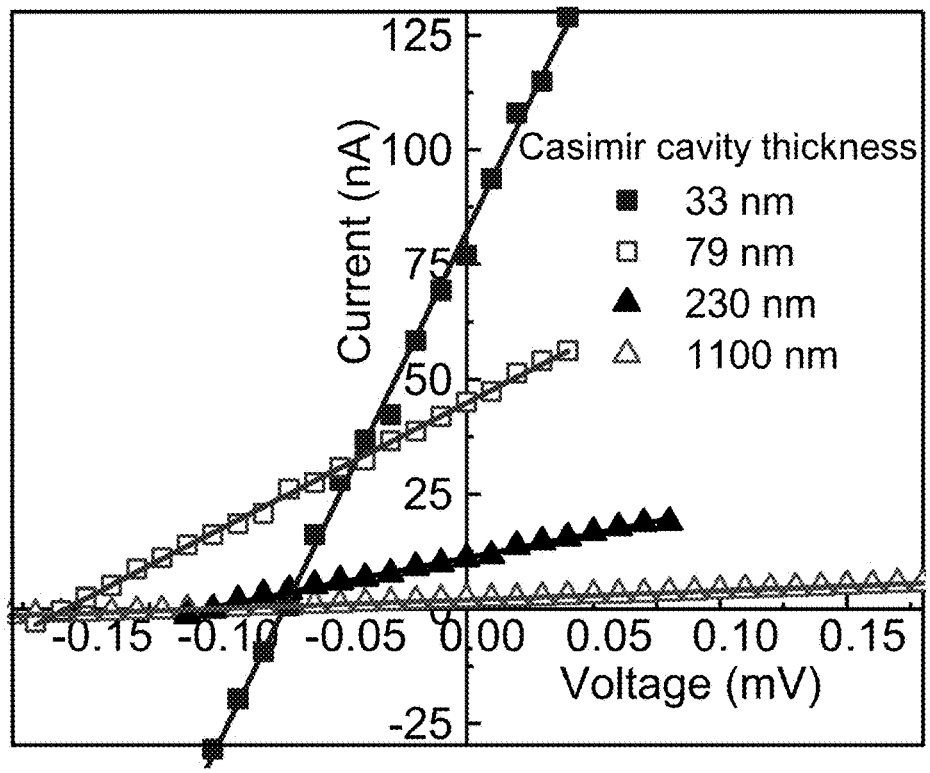
FIG. 14A provides data showing measured electrical current as a function of voltage for Casimir cavity photoinjector devices of different cavity thicknesses.
Figure 14B:
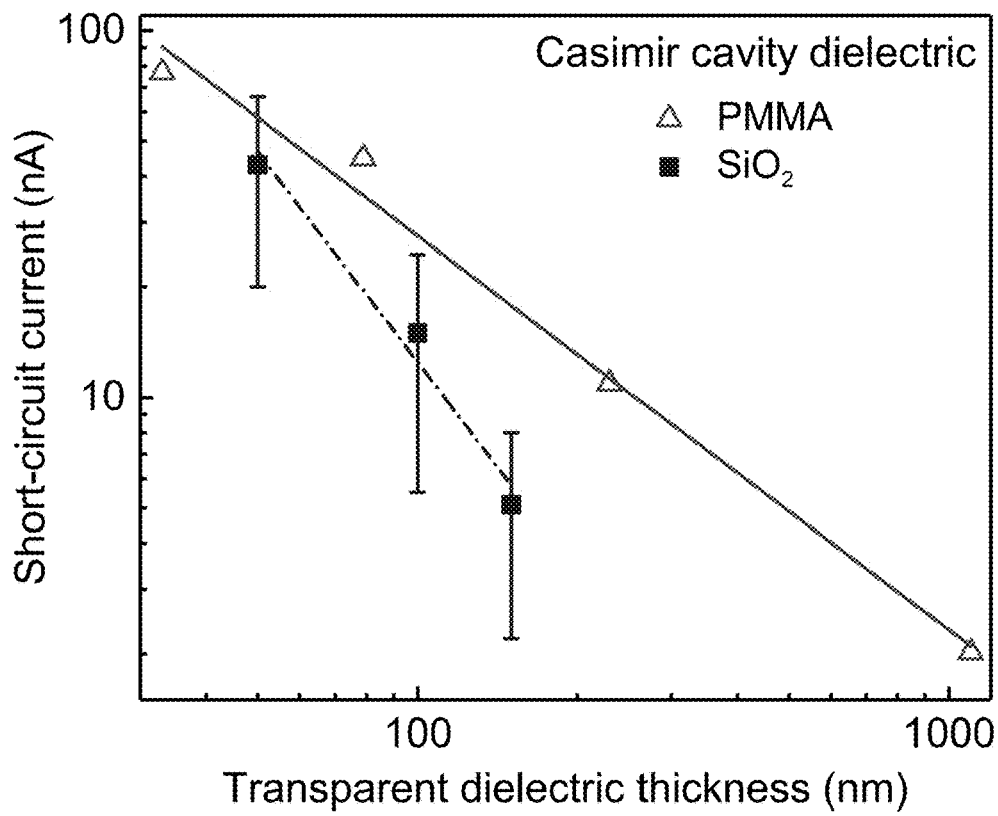
FIG. 14B provides data showing short circuit current as a function of cavity thickness for Casimir cavity photoinjector devices filled with either PMMA or $SiO_2$.

The electrical response of MIM devices having an adjoining optical cavity is shown in FIG. 14A and FIG. 14B. In FIG. 14A, the I(V) curves extend into the second quadrant, and therefore exhibit a positive power output. For linear I(V) characteristics, the maximum power is $|I_{SC}V_{OC}|/4$, where $I_{SC}$ and $V_{OC}$ are the short-circuit current and open-circuit voltage, respectively. For the device with a 33 nm thick cavity, the maximum power is 1.4 pW in a 0.02 µm² area (see SEM image of FIG. 12B). The short-circuit current increases for decreasing cavity thickness, as shown in FIG. 14B for two different cavity dielectrics. This increase in current with decreasing cavity thickness corresponds to an increasing range of suppressed optical modes with decreasing thickness, as described above.

To understand the current-producing mechanism, tests were carried out to determine whether there is evidence that it involves hot charge carriers generated from optical fields in the optical cavity. These carriers, generated in the Pd upper electrode near the interface to the transparent dielectric cavity shown in FIG. 11, could be injected into the insulator if they could traverse the Pd without being scattered. This photoinjection current should decrease for increasing upper electrode thickness due to increased scattering of the hot carriers before they reach the insulator, which results in excited carriers not contributing to the current. The hot electron mean-free path length in metals at room temperature is on the order of 10 nm. On the other hand, when the upper electrode thicknesses is below the absorption depth of Pd, which is 10 nm for 0.4 µm radiation, the photoinjection current would be expected to decrease for decreasing electrode thickness because the rate of carrier excitation is reduced. The short circuit current as a function of upper electrode thickness does, in fact, decrease with increasing thickness, and also decreases for the thickness below 10 nm, peaking for a Pd thickness of approximately 12 nm.

To be collected, these hot carriers must traverse the insulator either ballistically or via tunneling. The ballistic transport is limited by the mean-free path length in the insulator, on the order of several nanometers. The tunneling probability decreases exponentially with insulator thickness. In either case, the short-circuit current would be expected to decrease with increasing insulator thickness if the current is due to charge injection through the insulator. This trend was also observed.

Although devices were fabricated using the GSM process as well as standard photolithography, devices fabricated by both processes exhibited similar trends. The GSM process allowed for much shorter fabrication times, and the absence of residual photoresist (described above), but did not allow for large device areas or for varying the device area.

In metal/insulator/metal (MIM) tunnel devices adjoining thin optical cavities, a small output current and voltage has been consistently observed, as reproduced in over 1000 devices produced in 21 batches. When the cavities are made thinner, which corresponds to suppressing a wider range of optical modes, the current increases. The output scales with number of devices in parallel and series, and the current scales with device area. Changing the layer thicknesses in the MIM structure results in changes in current that are consistent with modifying the suppression of hot electron photoinjection from the side of the MIM structure adjoining the optical cavity.

Figure Captions for Example 1

FIG. 11. Device cross section, showing a metal/insulator/metal (MIM) structure adjoining an optical cavity. The electrical characteristics of the device are measured between the two metal layers of the MIM structure, where the polarity of the upper electrode voltage is with reference to the base electrode, which is defined as ground. Positive current is defined to be in the direction of the arrow.

FIG. 12A. Germanium shadow mask (GSM) device fabrication. Depiction of fabrication process, showing a cross-sectional view of materials deposited under a germanium bridge. The $NiO_x$ and $Al_2O_3$ insulating layer formed over the Ni layer is not shown. The active area of the device is formed in the overlap region. FIG. 12B shows a scanning electron microscope (SEM) image of a completed device, with an overlap area of 0.02±0.006 µm². The Ni and Pd-coated regions are indicated; the lightest regions, in the center and at the left and right-hand sides, are coated with both Ni and Pd layers with the insulator layer between them.

FIG. 13. Photolithographic device. Top view of devices formed by the standard photolithographic technique. The overlap of the *pallidum* upper electrode, shown to the right, with the nickel lower electrode, shown to the left, forms active square regions with edge lengths between 5 µm and 100 µm.

FIG. 14A and FIG. 14B. Electrical response as a function of cavity thickness. FIG. 14A: Current as a function of voltage for different PMMA cavity thicknesses. FIG. 14B: Short-circuit current as a function of cavity thickness for PMMA and $SiO_2$-filled cavities.

ILLUSTRATIVE ASPECTS

As used below, any reference to a series of aspects (e.g., "Aspects 1-4") or non-enumerated group of aspects (e.g., "any previous or subsequent aspect") is to be understood as a reference to each of those aspects disjunctively (e.g., "Aspects 1-4" is to be understood as "Aspects 1, 2, 3, or 4").

Aspect 1 is a device comprising: a conductive layer including a first portion and a section portion; and a zero-point-energy-density-modifying structure adjoining the first portion of the conductive layer, the zero-point-energy-density-modifying structure providing an asymmetry that drives a flow of energy between the first portion of the conductive layer and the second portion of the conductive layer.

Aspect 2 is the device of any previous or subsequent aspect, wherein the conductive layer comprises a component of the zero-point-energy-density-modifying structure.

Aspect 3 is the device of any previous or subsequent aspect, wherein the asymmetry produces a net flow of charge between the first portion and the second portion.

Aspect 4 is the device of any previous or subsequent aspect, wherein the asymmetry produces a voltage difference between the first portion and the second portion.

Aspect 5 is the device of any previous or subsequent aspect, wherein the first portion and the second portion of the conductive layer correspond to laterally adjacent portions of the conductive layer.

Aspect 6 is the device of any previous or subsequent aspect, wherein the asymmetry provides a difference in a zero-point energy density at the first portion of the conductive layer as compared to the zero-point energy density at the second portion of the conductive layer in an absence of the zero-point-energy-density-modifying structure.

Aspect 7 is the device of any previous or subsequent aspect, wherein the zero-point-energy-density-modifying structure is a zero-point-energy density-reducing structure.

Aspect 8 is the device of any previous or subsequent aspect, wherein the zero-point-energy-density-modifying structure comprises a Casimir cavity adjoining the conductive layer.

Aspect 9 is the device of any previous or subsequent aspect, wherein the Casimir cavity comprises: a first reflective layer; a cavity layer; and a second reflective layer, wherein the cavity layer is between the first reflective layer and the second reflective layer.

Aspect 10 is the device of any previous or subsequent aspect is the device of any previous or subsequent aspect is the device of any previous or subsequent aspect, wherein the conductive layer has a Seebeck coefficient with a room temperature absolute value of from 1 µV/K to 2000 µV/K or from 1 µV/K to 50 µV/K.

Aspect 13 is the device of any previous or subsequent aspect, wherein the conductive layer comprises a metal, nichrome, nickel, silver, copper, or graphene.

Aspect 14 is the device of any previous or subsequent aspect, wherein the conductive layer has a thickness of from 3 nm to 100 nm.

Aspect 15 is the device of any previous or subsequent aspect, wherein the conductive layer comprises a thickener region, and wherein the thickener region extends from the first portion to the second portion or wherein the thickener region is present at part of the first portion and at part of the second portion.

Aspect 16 is the device of any previous or subsequent aspect, wherein the conductive layer further includes a third portion and a fourth portion, and wherein the device further comprises: a second zero-point-energy-density-modifying structure adjoining the third portion of the conductive layer.

Aspect 17 is the device of any previous or subsequent aspect, wherein the third portion is laterally adjacent to the second portion, and wherein the fourth portion is laterally adjacent to the third portion.

Aspect 18 is the device of any previous or subsequent aspect, wherein the conductive layer is a first conductive layer having a first Seebeck coefficient of one polarity, and wherein the device further comprises: a second conductive layer including a third portion and a second portion, wherein the second conductive layer has a second Seebeck coefficient of opposite polarity as the first Seebeck coefficient, wherein the zero-point-energy-density-modifying structure adjoins the third portion of the second conductive layer, and wherein the first portion of the first conductive layer and the third portion of the second conductive layer are in electrical contact with one another.

Aspect 19 is the device of any previous or subsequent aspect, further comprising: a third conductive layer having a fifth portion and a sixth portion, wherein the third conductive layer has a third Seebeck coefficient of opposite polarity as the second Seebeck coefficient; and a second zero-point-energy-density-modifying structure adjoining the fifth portion of the third conductive layer, and wherein the sixth portion of the third conductive layer is in electrical contact with the fourth portion of the second conductive layer.

Aspect 20 is the device of any previous or subsequent aspect, wherein the conductive layer comprises a geometric diode.

Aspect 21 is the device of any previous or subsequent aspect, wherein the flow of energy generates a temperature difference between the first portion of the conductive film and the second portion of the conductive film.

Aspect 22 is the device of any previous or subsequent aspect is a device comprising: a first electrode; a second electrode; and a Casimir cavity adjoining the first electrode and the second electrode, the Casimir cavity comprising: a first reflector comprising at least a portion of the first electrode; a second reflector comprising at least a portion of the second electrode, and a cavity layer between the first reflector and the second reflector, the cavity layer comprising a transparent conductor layer in contact with the second electrode and a transport layer in contact with the first electrode.

Aspect 24 is the device of any previous or subsequent aspect is the device of any previous or subsequent aspect, wherein the first electrode has a thickness of from 5 nm to 1 cm, wherein the transparent conductor layer has a thickness of from 10 nm to 2 µm, wherein the transport layer has a thickness of from 0.3 nm to 50 nm, or wherein the second electrode has a thickness of from 5 nm to 1 cm.

Aspect 26 is the device of any previous or subsequent aspect, wherein the transparent conductor comprises a conductive polymer, a doped conductive polymer, a conductive polymer blend, a doped conductive polymer blend, or a transparent conducting oxide, wherein the first electrode or the second electrode comprises a metal, or wherein the transport layer comprises a dielectric, a semiconductor, or a metal oxide.

Aspect 27 is the device of any previous or subsequent aspect, wherein the cavity layer comprises a material having a transmittance of greater than 20% for at least some wavelengths of light from 100 nm to 10 µm.

Aspect 28 is the device of any previous or subsequent aspect, wherein the first reflector comprises the first electrode or wherein the second reflector comprises the second electrode.

Aspect 29 is the device of any previous or subsequent aspect, wherein the first reflector comprises an interface between the first electrode and the transport layer or wherein the second reflector comprises an interface between the second electrode and the transparent conductor.

Aspect 30 is the device of any previous or subsequent aspect, wherein a reflectivity of at least one of the first reflector or the second reflector is greater than 50%.

Aspect 31 is the device of any previous or subsequent aspect, wherein the first conductive layer includes a metamaterial that enhances hot carrier emission.

Aspect 32 is a device comprising: a Casimir cavity including: a first reflector, a second reflector, and a cavity layer between the first reflector and the second reflector, wherein an asymmetry between the first reflector and the second reflector or between an optical mode density at an interior of the Casimir Cavity and an optical mode density at an exterior of the Casimir cavity drives a flow of energy at least partially through the Casimir cavity.

Aspect 33 is the device of any previous or subsequent aspect, wherein the asymmetry between the first reflector and the second reflector corresponds to one or more of: the first reflector and the second reflector comprising different metals, the first reflector and the second reflector exhibiting different optical photoemission character from one another, or the first reflector including a metamaterial that enhances an optical absorption character of the first reflector as compared to the second reflector.

Aspect 34 is the device of any previous or subsequent aspect, wherein the flow of energy is at least partly between the first reflector and the second reflector.

Aspect 35 is the device of any previous or subsequent aspect, wherein the asymmetry is between the optical mode density at the interior of the Casimir Cavity and the optical mode density at an exterior of the Casimir cavity, and wherein the cavity layer includes a transparent conductor positioned to collect charge flowing into the cavity layer from the first reflector or the second reflector.

Aspect 36 is the device of any previous or subsequent aspect, wherein the flow of energy is at least partly between the interior of the Casimir cavity and the exterior of the Casimir cavity in a direction parallel to longitudinal axes of the first reflector and the second reflector.

REFERENCES

U.S. application Ser. No. 16/855,890, filed on Apr. 22, 2020, published as US 2020/0358376, and now issued as U.S. Pat. No. 11,133,758, U.S. application Ser. No. 16/855, 897, filed on Apr. 22, 2020 and published as US 2020/0358375, U.S. application Ser. No. 16/855,892, filed on Apr. 22, 2020 and published as US 2020/0357997, and U.S. application Ser. No. 16/855,897, filed on May 8, 2020 and published as US 2020/0395872, are hereby incorporated by reference in their entireties for all purposes.

U.S. Pat. Nos. 7,379,286, 8,803,340, and 9,581,142.

Alemu, Desalegn, et al., 2012, "Highly conductive PEDOT: PSS electrode by simple film treatment with methanol for ITO-free polymer solar cells," Energy & environmental science 5.11, 9662-9671.

Amollo, T. A., Mola, G. T., Kirui, M. S. K., & Nyamori, V. O., 2018, "Graphene for thermoelectric applications: Prospects and challenges. Critical Reviews in Solid State and Materials Sciences," 43(2), 133-157.

Atar et al., 2013, "Plasmonically enhanced hot electron based photovoltaic device," Optics Express 21:6, 7196-7201.

Blandford and Thorne, 2008, "Applications of Classical Physics," Lecture Notes Chapter 6, California Institute of Technology, Version 12.

Bodurtha, K., & Kakalios, J., 2013, "Thermopower of nanocrystalline germanium/hydrogenated amorphous silicon composite thin films," Journal of Applied Physics, 114(19), 193705.

Brongersma, 2015, "Plasmon-induced hot carrier science and technology," Nature Nanotechnology, 10:1, 25-34.

Chaikin, P. M., 1990, "An introduction to thermopower for those who might want to use it to study organic conductors and superconductors," Organic Superconductivity. Springer, Boston, MA 101-115.

Chalabi et al., 2014, "Hot-electron photodetection with a plasmonic nanostripe antenna," Nano Lett., 14:3, 1374-1380.

Clavero, 2014, "Plasmon induced hot-electron generation at nanoparticle/metal-oxide interfaces for photovoltaic and photocatalytic devices," Nature Photonics, 8:2, 95-103.

Dragoman, D., & Dragoman, M., 2007, "Giant thermoelectric effect in graphene," Applied Physics Letters, 91(20), 203116.

Du et al., 2013, "Ultrafast plasmon induced electron injection mechanism in gold-$TiO_2$ nanoparticle system." J. Photochem. and Photobiol. C: Photochem. Revs., 15, 21-30.

Gall, 2016, "Electron mean free path in elemental metals," J. Appl. Phys., 119:8, 085101.

Genet et al., 2003, "Casimir force and the quantum theory of lossy optical cavities," Phys. Rev. A., 67:4, 043811.

Gong et al., 2007, "Design of plasmonic cavities for solid-state cavity quantum electrodynamics applications," Appl. Phys. Lett., 90:3, 033113.

Hafezian, S., Beaini, R., Martinu, L., & Kéna-Cohen, S., 2019, "Degradation mechanism of protected ultrathin silver films and the effect of the seed layer," Applied Surface Science, 484, 335-340.

Helman et al., 1973, "Theory of internal photoemission," Phys. Rev. B, 7:8, 3702.

Herner et al., 2017, "High performance MIM diode based on cobalt oxide/titanium oxide," Appl. Phys. Lett., 110, 223901.

John et al., 2017, "Optical properties of graphene, silicene, germanene, and stanene from IR to far UV—a first principles study," J. Phys. and Chem. of Solids, 110, 307-315.

Kish, 2005, "Stealth communication: Zero-power classical communication, zero-quantum quantum communication and environmental-noise communication," Appl. Phys. Lett., 87:23, 234109.

Kish et al., 2016, "Zero-point term and quantum effects in the Johnson noise of resistors: a critical appraisal," J. Stat. Mech.: Theory and Experiment, 2016:5, 054006.

Knight et al., 2013, "Embedding plasmonic nanostructure diodes enhances hot electron emission," Nano Lett., 13:4, 1687-1692.

Kodama et al., 2001, "Fast heating of ultrahigh-density plasma as a step towards laser fusion ignition," Nature, 412:6849, 798.

Kurz, H., Esser, A., Heesel, H., Lucovsky, G., Wang, C., & Parsons, G., 1993, "Optical detection of photoconductivity in hydrogenated amorphous silicon, a-Si: H, in the sub-picosecond time domain," Journal of non-crystalline solids, 164, 575-578.

Lambe et al., 1976, "Light emission from inelastic electron tunneling," Phys. Rev. Lett., 37:14, 923.

Lebedev et al., 1999, "The dynamics of wire array Z-pinch implosions," Phys. of Plasmas, 6:5, 2016-2022.

Li, X., Yin, J., Zhou, J., Wang, Q., & Guo, W., 2012, "Exceptional high Seebeck coefficient and gas-flow-induced voltage in multilayer graphene," Applied Physics Letters, 100(18), 183108.

McCarthy et al., 1977, "Enhancement of light emission from metal-insulator-metal tunnel junctions," Appl. Phys. Lett., 30:8, 427-429.

Mizuguchi et al., 2007, "Simulation of high-energy proton production by fast magnetosonic shock waves in pinched plasma discharges," Phys. of Plasmas, 14:3, 032704.

Moddel, G. and Dmitriyeva, O., 2019, "Extraction of Zero-Point Energy from the Vacuum: Assessment of Stochastic Electrodynamics-Based Approach as Compared to Other Methods," Atoms, 7(2), 51.

Moddel, Garret, Ayendra Weerakkody, David Doroski, and Dylan Bartusiak, 2021, "Optical-cavity-induced current, *Symmetry* 13, no. 3: 517.

Moore, J. P., and R. S. Graves, 1973, "Absolute Seebeck coefficient of platinum from 80 to 340 K and the thermal and electrical conductivities of lead from 80 to 400 K." Journal of Applied Physics 44.3 (1973): 1174-1178.

Rahman, M. T., Mireles, K., Gomez Chavez, J. J., Wo, P. C., Marcial, J., Kessler, M. R., & Panat, R., 2017, "High Temperature Physical and Chemical Stability and Oxidation Reaction Kinetics of Ni—Cr Nanoparticles," The Journal of Physical Chemistry C, 121(7), 4018-4028.

Sze et al., 2006, "Physics of semiconductor devices," John Wiley & Sons, p. 682.

van Dorp et al., 2009, "SiC: a photocathode for water splitting and hydrogen storage," Angewandte Chemie Intl. Ed., 48:33, 6085-6088

Viswanath et al., 2019, "A nanosheet phosphor of double-layered perovskite with unusual intrananosheet site activator concentration," Chem. Eng. J., 122044.

Wang et al., 2000, "Light emission from the double-barrier Al/Al$_2$O$_3$/Al/Al$_2$O$_3$/Au tunnel junction," Thin Solid Films, 371:1-2, 191-194.

Wang et al., 2011, "Plasmonic energy collection through hot carrier extraction," Nano Lett., 11:12, 5426-5430.

Wang et al., 2017, "Field-assisted splitting of pure water based on deep-sub-debye-length nanogap electrochemical cells," ACS Nano, 11:8, 8421-8428.

Walter et al., 2010, "Solar water splitting cells," Chem. Rev. 110:11, 6446-6473.

Yan, J. W., Zhou, J. C., Zhang, C. S., & Yi, Y., 2008, "Electromechanical properties of nichrome (80/20 wt-%) thin film fabricated by low energy ion sputtering," Surface engineering, 24(3), 230-235.

Zhu, 2014, "Graphene Geometric Diodes for Optical Rectennas," PhD Thesis, University of Colorado, 68-77.

STATEMENTS REGARDING INCORPORATION BY REFERENCE AND VARIATIONS

All references throughout this application, for example patent documents including issued or granted patents or equivalents, patent application publications, and non-patent literature documents or other source material, are hereby incorporated by reference herein, as though individually incorporated by reference.

All patents and publications mentioned in the specification are indicative of the levels of skill of those skilled in the art to which the invention pertains. References cited herein are incorporated by reference herein to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resorting to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device comprising:
   a first electrode;
   a second electrode; and
   a Casimir cavity adjoining the first electrode and the second electrode, the Casimir cavity comprising:
      a first reflector comprising at least a portion of the first electrode;
      a second reflector comprising at least a portion of the second electrode, and
      a cavity layer between the first reflector and the second reflector, the cavity layer comprising a transparent conductor layer in contact with the second electrode and a transport layer in contact with the first electrode, wherein the transparent conductor layer and the transport layer comprise solid state materials, and wherein the transport layer comprises a material that is more insulating than the transparent conductor.

2. The device of claim 1, wherein the transparent conductor layer comprises a conductive polymer, a doped conductive polymer, a conductive polymer blend, a doped conductive polymer blend, or a transparent conducting oxide, wherein the first electrode or the second electrode comprises a metal, and wherein the transport layer comprises a dielectric, a semiconductor, or a metal oxide.

3. The device of claim 1, wherein the first electrode includes a metamaterial that enhances hot carrier emission.

4. A cavity transport device comprising:
   a Casimir cavity including:
      a first reflector comprising a first material,
      a second reflector comprising a second material, and
      a cavity layer between the first reflector and the second reflector, the cavity layer comprising solid state materials, and wherein an asymmetry (i) between the first reflector and the second reflector corresponding to a difference in composition or structure between the first material and the second material, or (ii) between an optical mode density at an interior of the Casimir cavity and an optical mode density at an exterior of the Casimir cavity drives a flow of energy at least partially through the Casimir cavity.

5. The cavity transport device of claim 4, wherein the asymmetry between the first reflector and the second reflector corresponds to one or more of:

the first material and the second material comprising different metals, the first material and the second material exhibiting different optical photoemission character from one another, or the first material including a metamaterial that enhances an optical absorption character of the first reflector as compared to the second reflector.

6. The cavity transport device of claim 4, wherein the flow of energy is at least partly between the interior of the Casimir cavity and the exterior of the Casimir cavity in a direction parallel to longitudinal axes of the first reflector and the second reflector.

7. The cavity transport device of claim 4, wherein the flow of energy is at least partly between the first reflector and the second reflector in a direction perpendicular to longitudinal axes of the first reflector and the second reflector.

8. A cavity transport device comprising:
a Casimir cavity including:
a first reflector comprising a first material,
a second reflector comprising a second material, and
a cavity layer between the first reflector and the second reflector, wherein an asymmetry between an optical mode density at an interior of the Casimir cavity and an optical mode density at an exterior of the Casimir cavity drives a flow of energy at least partially through the Casimir cavity, and wherein the cavity layer includes a transparent conductor positioned to collect charge flowing into the cavity layer from the first reflector or the second reflector.

9. The cavity transport device of claim 8, wherein the flow of energy is at least partly between the interior of the Casimir cavity and the exterior of the Casimir cavity in a direction parallel to longitudinal axes of the first reflector and the second reflector.

10. The cavity transport device of claim 8, wherein the flow of energy is at least partly between the first reflector and the second reflector in a direction perpendicular to longitudinal axes of the first reflector and the second reflector.

* * * * *